United States Patent
Heinrich

(10) Patent No.: US 8,139,704 B2
(45) Date of Patent: Mar. 20, 2012

(54) PHASE COMPENSATED RENORMALIZABLE DYNAMIC PHASE LOCKED LOOP

(75) Inventor: Kenn W. Heinrich, Oshawa (CA)

(73) Assignee: Cisco Technology, Inc., San Jose, CA (US)

( * ) Notice: Subject to any disclaimer, the term of this patent is extended or adjusted under 35 U.S.C. 154(b) by 682 days.

(21) Appl. No.: 12/276,857

(22) Filed: Nov. 24, 2008

(65) Prior Publication Data

US 2010/0020911 A1    Jan. 28, 2010

Related U.S. Application Data

(60) Provisional application No. 61/018,596, filed on Jan. 2, 2008, provisional application No. 61/025,888, filed on Feb. 4, 2008.

(51) Int. Cl.
*H03D 3/24* (2006.01)
(52) U.S. Cl. ........................................ 375/376; 327/156
(58) Field of Classification Search ............. 375/371, 375/376; 327/156
See application file for complete search history.

(56) References Cited

U.S. PATENT DOCUMENTS

| 6,809,598 | B1 | 10/2004 | Staszewski | |
|---|---|---|---|---|
| 7,109,763 | B1* | 9/2006 | Moyal et al. | 327/156 |
| 7,498,890 | B2* | 3/2009 | Wallberg et al. | 331/17 |
| 7,548,124 | B2* | 6/2009 | Chae et al. | 331/44 |
| 2003/0007586 | A1* | 1/2003 | Ishii | 375/376 |
| 2007/0085622 | A1* | 4/2007 | Wallberg et al. | 331/179 |

FOREIGN PATENT DOCUMENTS

| EP | 0 577 329 A | 1/1994 |
|---|---|---|
| EP | 1 217 745 A | 6/2002 |

OTHER PUBLICATIONS

PCT International Search Report—3 pgs., Mar. 2, 2009, Cisco Technology, Inc.
PCT Written Opinion—5 pgs., Mar. 2, 2009, Cisco Technology, Inc.

* cited by examiner

*Primary Examiner* — Jean B Corrielus
(74) *Attorney, Agent, or Firm* — Tarolli, Sundheim, Covell & Tummino LLP

(57) ABSTRACT

A variable bandwidth phase locked loop (PLL) includes renormalizable circuitry configured to allow a gain of the PLL to be changed without causing a disturbance, and a phase compensation circuit configured to adjust a final output phase of the PLL based on parameter changes supplied to the PLL.

14 Claims, 22 Drawing Sheets

Error Handling

Error Handling With Limited Correction

PHASE COMPENSATED RENORMALIZABLE DYNAMIC PHASE LOCKED LOOP

This application claims the benefit of U.S. Provisional Application No. 61/018,596, filed Jan. 2, 2008, and the benefit of U.S. Provisional Application No. 61/025,888, filed Feb. 4, 2008, both of which are incorporated herein by reference in their entireties.

FIELD OF THE INVENTION

Embodiments of the present invention relate to systems and methods for combining or multiplexing a plurality of transport streams into a single transport for transmission, e.g., via satellite.

BACKGROUND OF THE INVENTION

Single Frequency Networks (SFN)

An SFN network requires delivery of temporally aligned digital transports to adjacent transmitters. The SFN modulation permits locally adjacent signals to reinforce one another but at the cost of rigorous control and timing. Global Position Satellite (GPS) information is employed at stream source and destination transmitter sites to precisely synchronize data carriage. Data packets defining mega frames are inserted at source for this purpose.

Bit streams must be delivered identically to each site with comparable timing. Dropped packets or substituted packets could result in destructive interference between transmitters. If expected packet counts do not match framing constraints within the mega frames, then the modulators will attempt to resynchronize. During this time, the affected modulator drops its broadcast, leaving adjacent transmitters in operation. While regional signal strength is reduced, the signal is not corrupted.

A SFN also provides for a reference system delay through the delivery path. In theory, this allows DVB-T modulators to coordinate transport broadcast relative to the GPS reference. It should be sufficient for modulators to receive the data stream within the system delay and then buffer it for play out according to framing dictates. In practice, however, some modulators are sensitive to packet jitter and may misinterpret jitter as a timing violation and, again, initiate a resynchronization process.

In summary, the streams must be delivered without addition or deletion, they must observe system timing, and they must not present excessive packet jitter.

Fibre Delivery

Fibre delivery, as with Asynchronous Transfer Mode (ATM) in a dedicated system, offers high reliability and low error rate without introducing significant timing artifacts. If the source transport is generated according to the SFN standard, then receiving modulators should have no difficulty. Of course, fibre must be installed and local terrain must permit installation.

Satellite Delivery

A satellite solution could offer lower cost of installation than fibre, shorter time to deployment, greater security of the transmission path and access to difficult geographical regions.

Unfortunately, satellite reception may be impaired by locally originating sources of RF noise (e.g. electric motors), by regional sources (weather), or widespread conditions (weather, sun outage events). Error correction as provided by DVB compliant systems is effective but not perfect. Wireless systems as they exist now cannot be free of transmission errors. Additionally, satellite positional drift introduces additional packet jitter. The net result of such issues variously could be interference in local regions, reduced transmitter contributions as modulators reset, or widespread outages.

Therefore, an acceptable broadcast solution requires additional resilience to data loss and a means to limit packet jitter, especially when combining multiple transport streams.

SUMMARY OF THE INVENTION

In accordance with embodiments of the present invention, a satellite delivery system conveys multiple DVB-T transport streams (e.g., terrestrial digital television—TDT) via a single carrier to a geographically distributed population of DVB-T Single Frequency Network (SFN) modulators. Aspects of the present invention provide a level of security in an effort to prevent unauthorized use of the data. Also, an in-band data scheme is provided to permit the receivers in the system to acquire and route the individual DVB-T transports.

The system, referred to also as secure, combined, interoperable multiplexing—"SciMux," resolves the satellite transport and timing issues while still maintaining routing flexibility and adding data security and system control. Embodiments of the present invention include one or more Digital Transport Formatters (DTFs), a population of Multiple Transport Receivers (MTRs), and an In-Band Controller (IBC). The DTFs employ a combining methodology to process, e.g., TDT transport stream (TS) applied to their inputs. The resultant MPEG/DVB stream is routed to a DVB-S2 modulator and upconverter. The signal is beamed to a satellite transponder and is ultimately received by one or more MTRs. The MTRs apply the inverse of the combining methodology to extract the TDT streams and route them to the DVB-T modulators.

Combining Methodology

The SciMux combining methodology permits multiple TS's to be combined together into a compliant MPEG/DVB TS. Each contributing TS is completely re-encapsulated with a single packet identification (PID) applied to each packet assembled for that TS. The encapsulation adds an overhead at the ratio of 4/184 (184 bytes of the original packet plus 4 bytes for a new header). Multiple TS's may be combined using this approach. However, combining TS's in this fashion introduces significant packet jitter. This is exacerbated by combining TS's of greatly different bit rates. To counter this and other packet jitter sources, customized Adaptation Fields (AF) are also preferably incorporated.

Timestamps for packet arrival to the system and timestamps for the combined packets are coordinated within the AFs. The AFs are fully MPEG/DVB compliant and the contained Program Clock References (PCR) may be restamped as the combined transport is routed through successive compliant devices such as DVB-S2 modulators. The receivers utilize the clock references within the AFs to synchronize output phase locked loops relative to the original timing. This corrects packet jitter introduced during the combining process, during satellite transmission and other transmission stages to that of the original sources within the MPEG/DVB specified tolerance.

Additional services and PSI/SI tables may be added to the combined TS. Some tables may require additional modification for the most complete implementation of this system. Program Management Tables (PMTs) identify combined transports with a specific identifier. In this application, the MPEG Service ID takes on a different meaning as Combined Transport ID (CT ID). The PMT also identifies the Combined Transport Name (CT Name). The CT ID/Name allows receivers to locate the combined transport within a carrier transport and then, ultimately, to locate a program or PID within that combined transport.

The MPEG fields normally used to identify transport ID are labeled in this design as Carrier Identification (Carrier ID) to associate the encompassing transport in customer applications with the transmission scheme. The foregoing table modifications are part of a data substructure that facilitates the deployment of in-band data for system control of receivers.

DTF

In a preferred implementation, the DTF provides:
TS formatting per the SciMux combining methodology
Payload scrambling
Table insertion
Basic multiplexing A DTF applies the SciMux combining methodology to one or more input TS. In one embodiment, these TS need only comply with the MPEG standard. They may mix any combination of formats such as DVB-S, DVB-H, DVB-T and so forth. As noted, each TS is assigned a single PID. Additional services may be multiplexed along with the thus-generated SciMux streams, but proper PID assignment must be observed. One implementation utilizes DVB-ASI as output, but this is not the only data format that may be used.

Each combined SciMux TS may be scrambled using the DVB-CS algorithm and BISS standards. Provided that the receivers are similarly equipped, other Conditional Access (CA) systems may be employed.

The DTF may operate in a stand-alone installation in which it supplies key tables such as the PMT with the additional descriptor for CT ID. It is even permissible to operate the system without the modified tables being present or having ever been transmitted. In such circumstances, receivers must be configured with documented system parameters. Alternatively, the In-Band Controller output may be multiplexed in to provide system reference and control.

MTR

The MTR may provide:
DVB-S/S2 demodulation
TS demultiplexing and decombining per the SciMux combining methodology
Packet error adjustment
BISS descrambling
Stream routing
PID filtering and copying
PLL recovery of original TS rate
System response to In-Band Data (IBD)

In an actual implementation, each MTR is capable of receiving up to four (4) DVB-S/S2 RF signals, each of which may contain up to eight (8) combined TS's. Up to six (6) streams may be routed to the outputs. Routed streams may be in a raw format, filtered, or decombined to suit the specific application. Each decombined TS may be descrambled using a separate BISS Session Word. Other implementations may have more or less than four (4) DVB-S/S2 RF signals and may have more or less than six (6) streams routed to outputs.

The MTR requires compliant packet headers. The sync byte, 0x47, is utilized to synchronize combined transport PIDs and facilitate the stripping away of the upper layer of encapsulation.

Additional error handling is preferably aided by modifications within packet headers.

The AFs are used to drive the PLLs when decombining transports. The AFs also are used to facilitate sync byte tracking in support of output packet framing.

The modulation techniques need not be restricted to DVB-S/S2, the input formats need not be restricted to RF, the output formats need not be restricted to DVB-ASI, the outputs need not only feed SFN networks, the transport stream formats need not be restricted to DVB-T, and the number of combined transports per carrier need not be limited to eight (8), nor must a carrier be limited to only combined transports. In this regard, the system provides significant flexibility.

MTRs or any other receivers may move seamlessly between SciMux and MPEG/DVB programs
SciMux TS are identifiable by the added PMT descriptor
The NIT identifies all MPEG/DVB programs and SciMux TS
Programs within the SciMux TS may be identified as programs tuned to the same location as the SciMux TS
Evaluation of the SciMux TS after decombining resolves program identification
The same carrier may support both SciMux and MPEG/DVB TS formats simultaneously
Both MTRs and more familiar MPEG/DVB receivers may tune to the same carrier for their respective formats and content Interpretation of IBD by MTRs allows system configuration of MTRs and tracking of both carriers and included combined TS. Additionally, system operators may impose administrative controls on individual or grouped MTRs.

The system defined herein allows for varied product solutions. For example, the current embodiment includes an additional receiver (STB) design that permits end-user reception in parallel to the SFN network. Individual STBs may be deployed in low population density areas as an alternative to installing an expensive DVB-T transmitter. The STB principally serves to decode MPEG video and audio elementary streams while foregoing the routing capabilities of the MTR.

The STB may provide:
DVB-S/S2 demodulation
TS demultiplexing and decombining per the SciMux combining methodology
BISS descrambling
Video and audio decoding of MPEG streams
System response to In-Band Data (IBD)

These and other features of embodiments of the present invention will be more fully appreciated upon a reading of the following detailed description in conjunction with the several associated drawings, which are listed immediately below.

DETAILED DESCRIPTION

Figure 1:
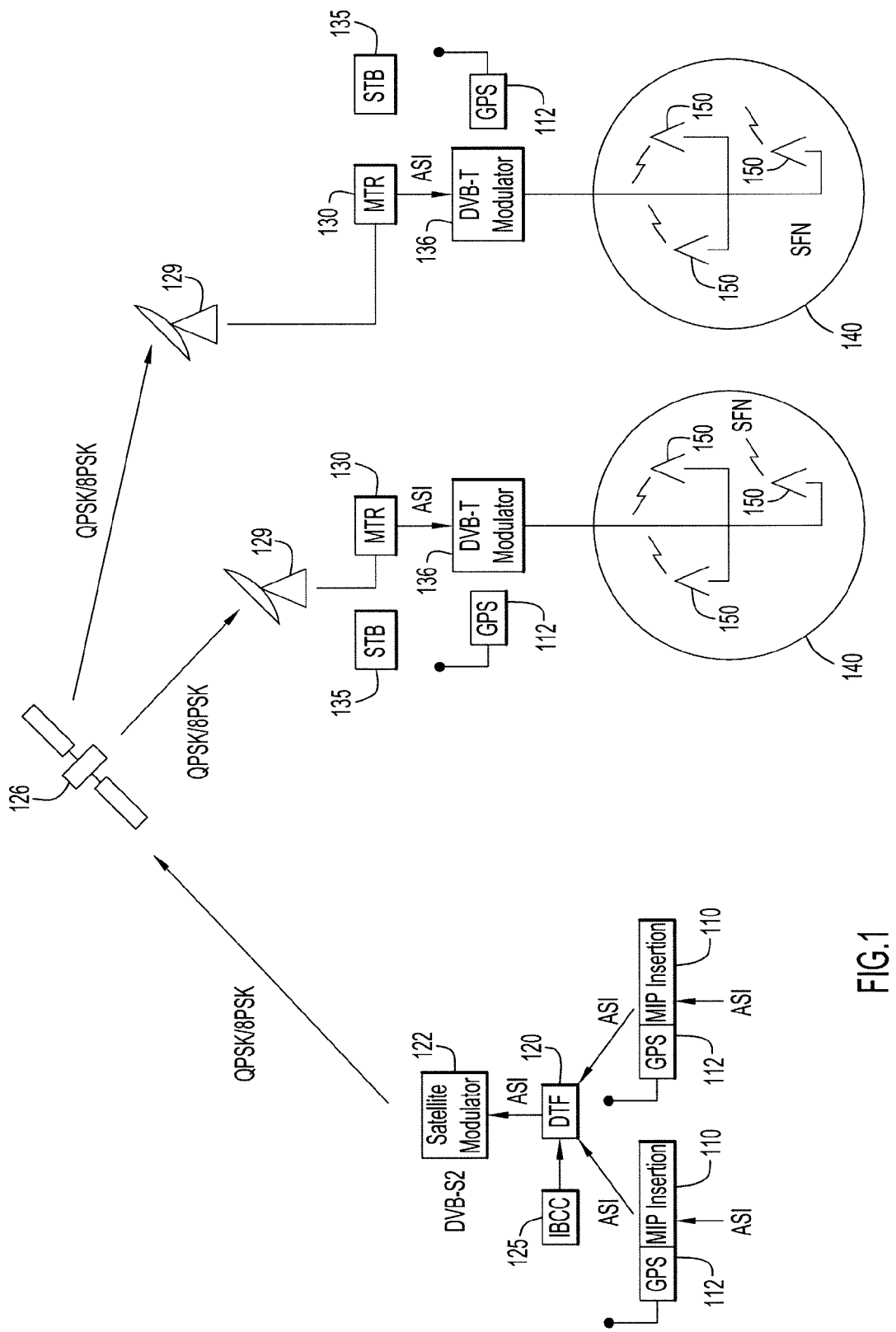
FIG. 1 is a an overall system diagram showing the location of a DTF and multiple MTRs in accordance with an embodiment of the present invention.

The following terms and acronyms are used throughout this document

| | |
|---|---|
| AF | Adaptation Field |
| ASI | Asynchronous serial interface |
| BISS | Basic Interoperable Scrambling System |
| CA | Conditional Access |
| CC | Continuity count |
| Combiner | A term specific to the present invention. It refers to any device or process which turns an MPTS or SPTS MPEG-2 transport stream (the source stream) into a single PID by embedding the bytes of the source stream unmodified into the payload of a combined PID (also called a combined stream). Typically a combiner outputs 188 packets for every 184 input packets (or 204 for 184 if carrying complete 204 byte source packets), although this ratio is not exact due to the extra space required to send other data in the adaptation field. |
| Combined Transport Identifier | The DVB service identifier that uniquely references a combined stream in the network. This does not refer to the transport identifier of the encompassing transport stream. |
| Combined Stream | A term specific to the present invention. It refers to a source stream that has been combined and re-packetized to occupy packets identified by a single PID as produced by a combiner (e.g. DTF). A combined stream may also be referred to as a combined PID. An equivalent term with respect to MPEG/DVB data services is the elementary stream. |
| CPU | Central Processor Unit (in MTR) |
| CT ID | Combined Transport ID |
| CT Name | Combined Transport Name |
| DCM | Digital Content Manager |
| DDS | Direct Digital Synthesizer. A numerically controlled oscillator that provides clocking to the PLL |
| De-combiner | A term specific to the present invention. It refers to any device or process which performs the inverse of the combiner process, i.e. extracting the original source stream from the packets of one combined PID. |
| DTF | Digital Transport Formatter. A combiner which formats a number of source streams through re-encapsulation into an equivalent number of combined PID outputs while also correcting system timing. |
| DVB | Digital Video Broadcasting |
| DVB-ASI | Digital Video Broadcasting - Asynchronous serial interface |

-continued

| | |
|---|---|
| DVB-H | DVB-Handheld |
| DVB-S | DVB-Satellite |
| DVB-S2 | DVB-Satellite 2 |
| DVB-T | DVB-Terrestrial |
| EMM | Entitlement Management Message |
| ES | Elementary Stream |
| FEC | Forward Error Correction. A method of encoding error correcting information into a DVB-S/S2 RF carrier |
| GPS | Global Positioning Satellite |
| IBC | Inband Controller |
| IBCC | Inband Control Computer |
| IBD | Inband Data |
| ICR | Input Clock Reference - a sample of an input clock phase counter used to drive a digital PLL |
| IRD | Integrated Receiver Decoder |
| MIP | Megaframe Insertion Packet. A data packet specifically defined by the DVB-T specification to GPS synchronized timing information to DVB-T modulators in an SFN network. |
| MPTS | Multi-Program Transport Stream (contrast SPTS) |
| MSB | Most significant bit. The highest nominal value bit, by position, in an n-bit word |
| MTR | Multiple Transport Receiver |
| NIT | Network Information Table |
| PAT | Program Association Table |
| PCR | Program Clock Reference - This is a standard MPEG-2 term. A snapshot of the SCR, carried in the adaptation field of selected transport packets. The value in the snapshot refers to the time at the instant of transmission of the final byte of the PCR field. Thus, the PCR value is nominally its own transmission time |
| PID | Packet ID |
| PMT | Program Management Table |
| PSI/SI | Program Specific Information/Service Information |
| RCR | Recovered Clock Reference - a clock phase counter output of a digital PLL, corresponding to the clock recovered from the ICR samples |
| SCR | System Clock Reference |
| SDT | Service Descriptor Table |
| SFN | Single Frequency Network |
| Source stream | A term specific to the present invention. It refers to the original transport stream (MPTS or SPTS) as it enters the DTF input. |
| SPTS | Single Program Transport Stream (contrast MPTS) |
| STB | Set-top box (receiver with decoding capabilities) |
| STS | Source Time Stamp - This is a term specific to the present invention. A snapshot of the SCR, carried in the adaptation field of selected transport packets. The value in the snapshot refers to the time at which the most recent source stream transport packet byte arrived at the DTF input. Because the STS is carried in the combined PID's adaptation field, not a source stream adaptation field, the STS value is *not* nominally its own transmission time. The STS is carried in the adaptation field's private data |
| SW | (BISS) Session Word |
| TDT | Terrestrial Digital Transmission. A synonym for DVB-T |
| TEI | Transport Error Indicator |
| TS | Transport Stream |

A. SciMux

At high level, embodiments and features of the present invention provide a flexible, secure, compliant "pipe" for carriage of multiple transport streams (TS's). Also referred to herein as "SciMux" (for secure, combined, interoperable multiplexing), aspects of the present invention are particularly suitable to provide a reliable satellite transmission mechanism for distribution of DVB-T TS into SFN networks. Packet rate control permits SciMux to operate alongside other transmission media such as fibre, even for SFN applications. In addition, varying transport formats and bit rates may be mixed, varying data formats may be utilized through the pipe without impairment of packet timing (e.g. DVB-ASI to IP to DVB-ASI), and a SciMux generated TS may be routed through MPEG/DVB compliant devices without impairment of packet timing. Further, entire transports may be managed on the basis of a single PID and the most basic of PSI/SI tables.

Conditional Access (CA) systems unfamiliar to SciMux may be routed through the pipe even as BISS scrambling is applied to the combined TS.

SciMux TS may be multiplexed with MPEG/DVB programs in a network solution
- For the same carrier(s), receivers may be a mixed population of receiver/routers and/or decoders
- Provided that PSI/SI tables are correctly configured, devices may channel change from any SciMux program to an MPEG/DVB program and back again
- An IRD equipped with SciMux functionality may participate in a CA system completely independent from the SciMux BISS mechanism—CA within CA SciMux may also apply the process recursively so that a transport may contain groups of combined transports
- Each successive layer incurs the additional overhead at the rate of 4/184 plus the inclusion rate of AF
- End users either must apply the recovery algorithm for as many layers as have been applied or be at the end of a chain of devices that apply the recovery algorithm successively for as many layers as exist
- Although not necessarily efficient, it is possible for the layering of SciMux programs to route completely different networks to a population of decoders. As an example,
  i. The first layer of receivers applies routing as dictated by the network controller
  ii. The next layer may be decoders that receive both SciMux and MPEG/DVB TS
  iii. With or without adjusting RF parameters, any quantity or group of decoders may be switched to a completely new network
    1. An underlying assumption is that both the original and subsequent network provide seamless CA control Packet header modifications improve packet count tracking.

System distribution and use of BISS keys with encrypted controls.

Referring now to FIG. 1, there is shown a satellite distribution system that may serve a plurality of single frequency networks (SFNs) 140. Specifically, there is a plurality of MIP insertion modules 110 that receive an asynchronous serial (ASI) stream and encodes the same with GPS timing information from GPS units 112, as is well-known in the art. The thus-encoded ASI streams are then delivered to a digital transport formatter (DTF) 120 that, as will be explained in detail herein below, combines the several ASI transport streams into a single ASI stream that is, in one embodiment, compliant with relevant MPEG/DVB TS standards. The output of DTF 120 is passed to a DVB-S2 satellite modulator 122 for uplink to a satellite 126 using, e.g., QPSK/8PSK modulation techniques, also well-known to those skilled in the art. An InBand Control Computer (IBCC) 125 may also provide a stream of information to DTF 120, which stream will also be combined into the single ASI stream. The IBCC 125 can be used to control/configure individual ones or groups of downstream Multiple Transport Receivers (MTRs) 130, as will be explained in detail later herein.

As further shown in FIG. 1, satellite 126 acts as a "bent pipe" and downlinks the signal to one or more (typically many) receiver sites 129. In the case of the instant invention, each receiver site 129 includes a multiple transport receiver (MTR) 130 that performs a de-combining function to "undo" the combining performed by the DTF 120. As will be explained in more detail later herein, the MTRs 130 may be controlled/configured by inband data (IBD) that is supplied by IBCC 125 through DTF 120. For example, the IBD transmitted from the IBCC may command one or more MTRs at a time to tune to specific RF carriers and to select and decombine specific combined transports to each available MTR output. This provides a flexible network control solution. IBD may command MTRs (as well as set top boxes (STBs) 135) individually or as members of a group or groups. Group control may be exerted over all inputs and outputs or just a single control element. Thus, one downstream device may be under control of several groups simultaneously. As an MTR 130 performs its TS de-combining function, it passes the resulting streams to one or more DVB-T modulators 136 (which also use as GPS timing signals as a reference) which serves a plurality of antennas 150 within a respective single frequency network 140. Antennas 150 are driven by emitters/transmitters as is well known in the art.

Digital Transport Formatter (DTF)

Figure 2:
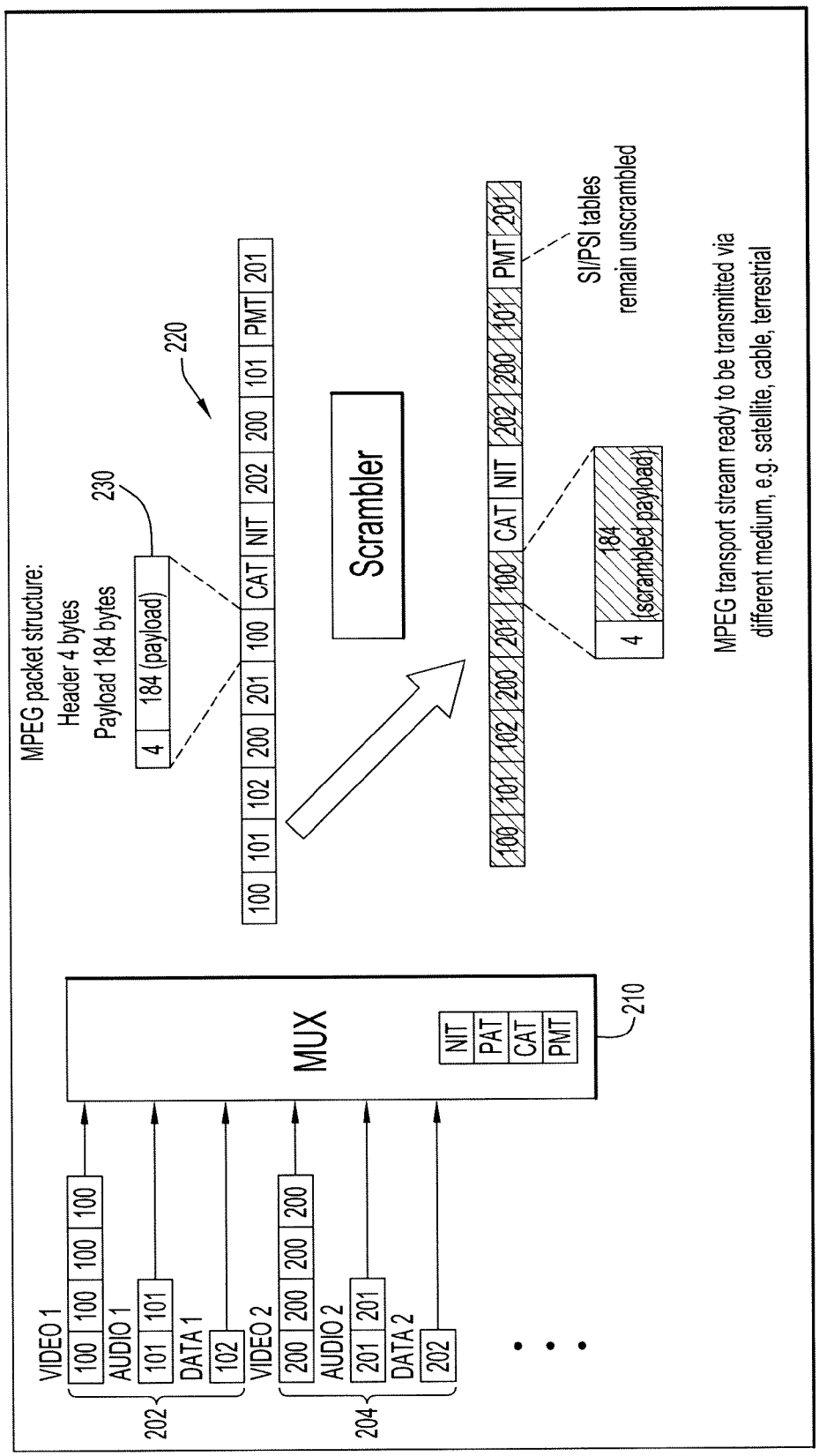
FIG. 2 depicts the effects of an MPEG compliant multiplexer and scrambler that may be used in conjunction with embodiments of the present invention.

Before describing the function of DTF 120, it is instructive to review a conventional multiplexer that operates on MPEG compliant elementary streams to generate a transport stream. As shown in FIG. 2, video 1, audio 1 and data 1 (collectively, encoded data 202) and video 2, audio 2, and data 2 (collectively, encoded data 204) are supplied to multiplexer 210. The output of the multiplexer is a transport stream 220 that interleaves the various packets for encoded data 202 and 204 along with packets that contain NIT, PAT, CAT and PMT information. As shown, and in compliance with the MPEG standard, each packet 230 has a structure that comprises 184 bytes for a payload, and 4 bytes for a header, for a total of 188 bytes per packet.

Once transport stream 220 is generated, portions thereof may, if desired, be scrambled. Notably, the NIT, PAT, CAT and PMT information packets (also referred to as "SI/PSI" for system information or program specific information) are typically not scrambled so as to enable a downstream decoder to readily process that information without having to unscramble the content thereof.

Figure 3A:
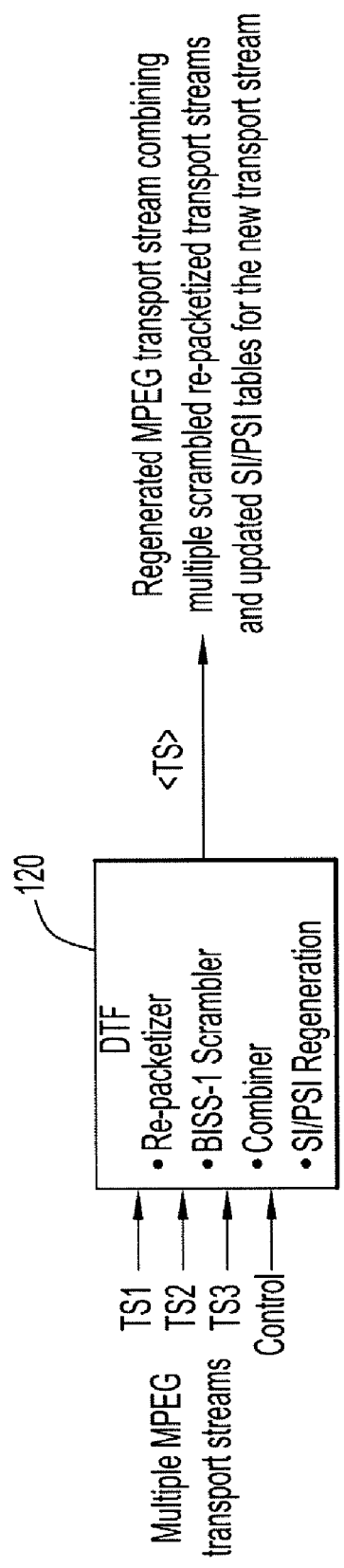
FIG. 3A is a schematic diagram of a DTF in accordance with an embodiment of the present invention.

FIG. 3A depicts a generalized schematic diagram of a DTF 120. As shown, multiple e.g., MPEG-compliant, transport streams TS1, TS2, and TS3 are applied to DTF 120, along with control information. DTF 120 processes this input in various ways. First DTF 120 "re-packetizes" packets of the respective streams TS1, TS2, and TS3. Second, it may scramble at least a portion of the resulting packets in accordance with the well-known BISS-1 standard. The DTF 120 then combines the respective streams TS1, TS2, and TS3 into a single stream, and finally generates SI/PSI tables for the single stream. Some functions provided by the host DCM in the current embodiment, such as SI/PSI regeneration, are associated with the DTF to better develop DTF concepts. Those skilled in the art recognize that the difference is essentially a product packaging exercise and does not affect the nature of the design.

Figure 3B:
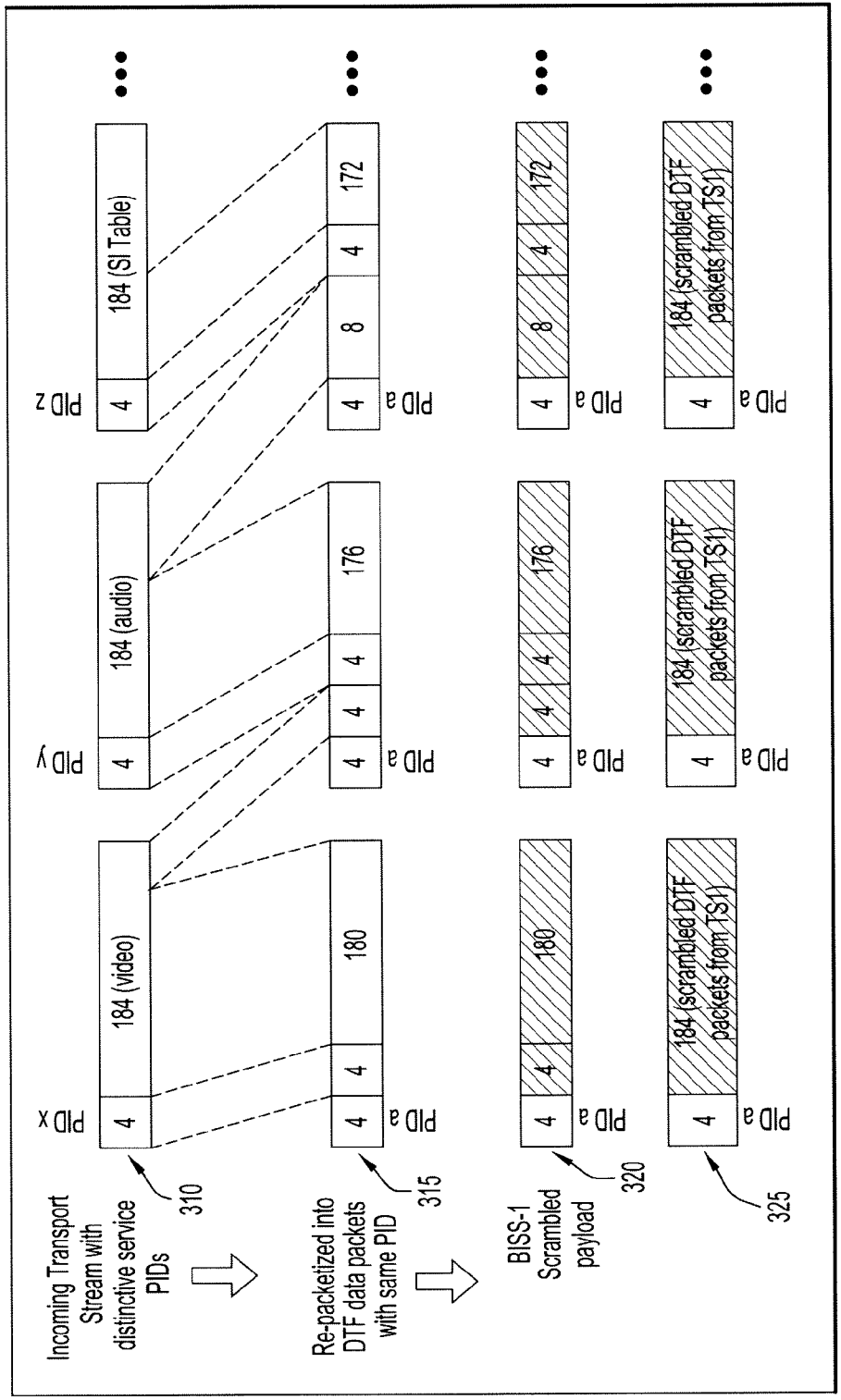
FIGS. 3B and 3C depict the effects of a DTF on multiple transport streams in accordance with an embodiment of the present invention.

FIG. 3B provides a more detailed illustration of the re-packetizing function of the DTF 120. As shown, an incoming TS 310 includes distinctive packet headers (comprising 4 bytes of the total of 188 bytes) for respective packets. This incoming stream 310 is then "re-packetized" into a DTF generated data packets with a same PID to create a repacketized stream 315. As shown in FIG. 3B, because each of the DTF generated packets are assigned a new PID, and the DTF generated packets still comply with, e.g., the MPEG-2 standard of a total of 188 bytes per packet, the original packets of the incoming stream 310 are split up among two or more DTF generated packets.

Payloads of packets in the re-packetized stream 315 may then be scrambled to produce the stream 320, which as shown by stream 325, appears to be an MPEG-2 compliant 188-byte (including 4-byte header) packet stream, where each packet contains scrambled DTF generated packets from, e.g., TS1.

Figure 3C:
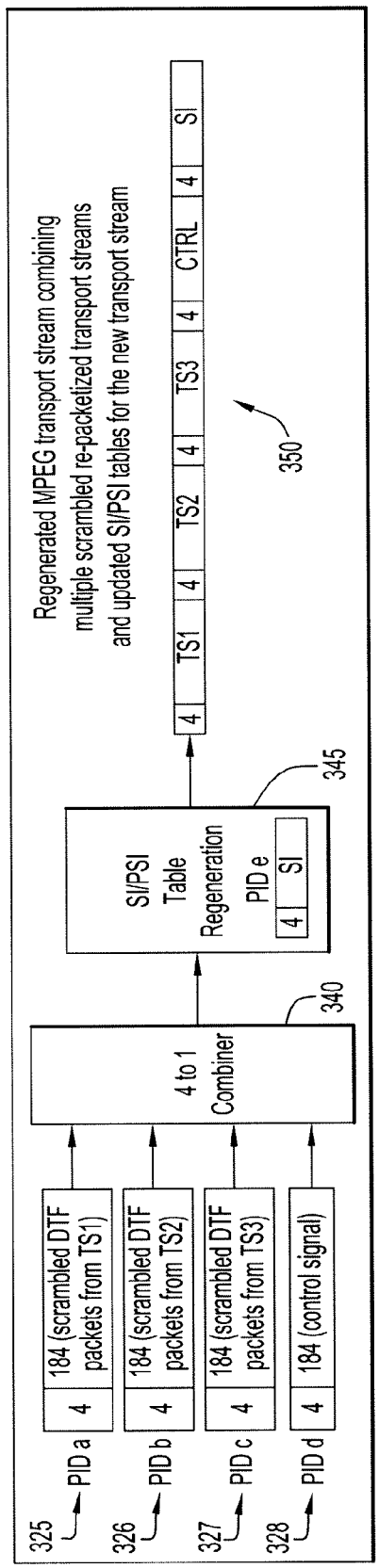

FIG. 3C depicts the final combining function supported by DTF 120. Assuming the process depicted in FIG. 3B is applied to each of incoming TS1, TS2 and TS3, a 4-to-1 combiner 340 then takes each of the respective DTF generated streams 325, 326, 327 for each of TS1, TS2, and TS3, along with a control packet stream 328, and generates in combination with SI/PSI table regeneration module 345, an MPEG transport stream (TS) 350 that combines multiple scrambled re-packetized transport streams and updated SI/PSI tables.

Figure 4:
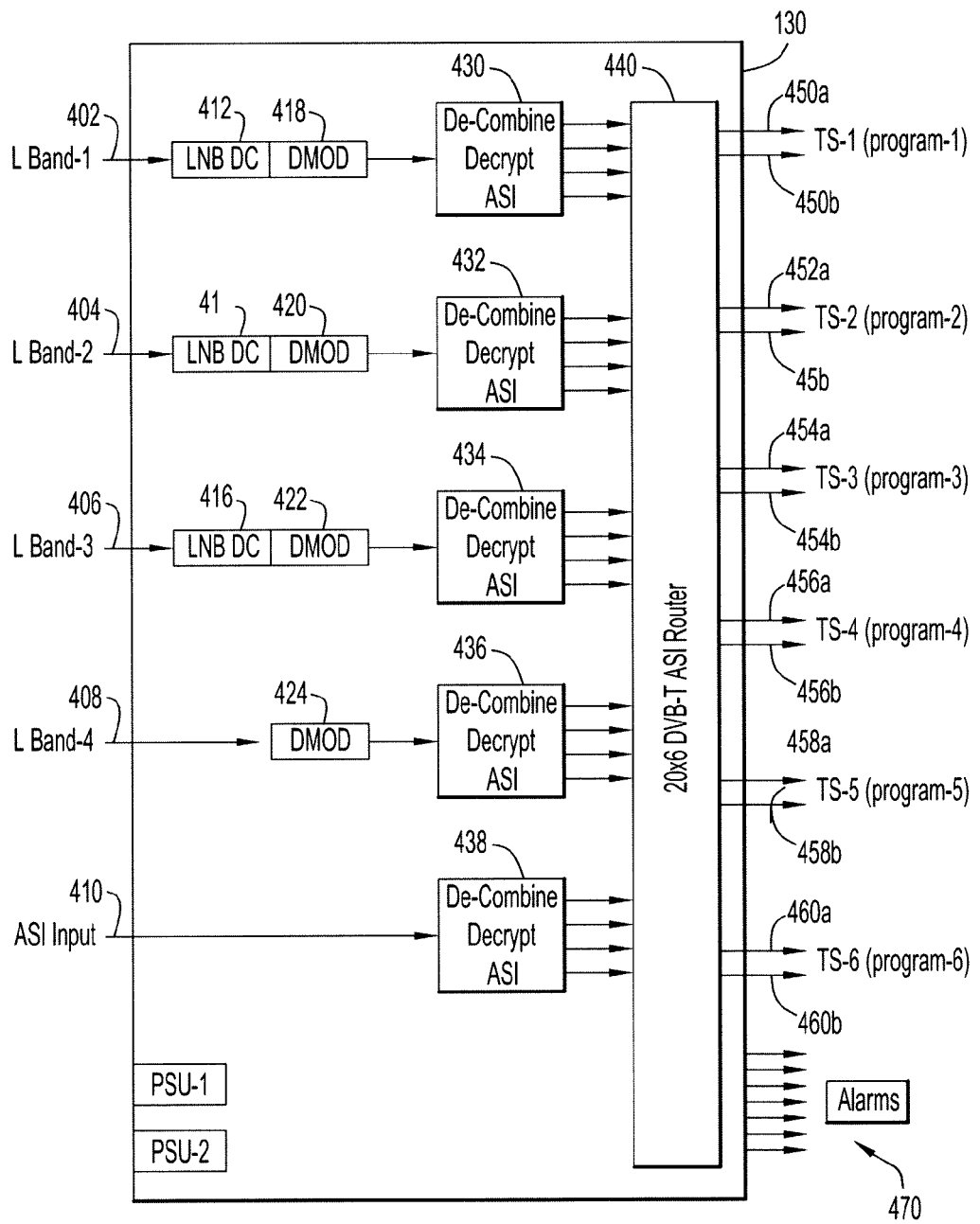
FIG. 4 depicts components of an MTR in accordance with an embodiment of the present invention.

FIG. 4 depicts an example of an MTR 130 in accordance with an embodiment of the present invention. MTR 130 may be configured as a 1 RU digital receiver that supports up to four DVB-S/S2 signals that match four L-band inputs containing multiple DVB-T transport streams within each signal (up to four per satellite transport), decrypts BISS scrambled signals and decombines DVB-T transports and outputs these on dual redundant ASI output connectors (for, e.g., a maximum six ASI connector pairs). In addition MTR 130 comprises an ASI input port that could be used in the satellite uplink sites for monitoring any of the satellite (carrier) signals. The signals departing an MTR 130 are, as has been mentioned already, SFN compatible and feed standards based DVB-T modulators.

Referring again to FIG. 4, MTR 130 includes multiple inputs (e.g., L-band inputs) 402-410, with the first three inputs 402, 404, 406 feeding respective low noise block (LNB) amplifiers 412-416, which in turn feed respective demodulators 418-422. Outputs of the demodulators, including demodulator 424, are fed to respective de-combiner/decrypting modules 430-436. ASI input 410 is fed directly to de-combiner/decrypting module 438. Outputs of these modules are then fed to router 440, which delivers, via its redundant outputs 450a, 450b, . . . 460a, 460b six original transport streams such as TS-1 shown in FIG. 3A, or TS 310 shown in FIG. 3B that was initially supplied to DTF 120.

MTR 130 may also be configured to provide a plurality of alarms, including Stream (DVB-S/S2 level), hardware malfunction, or software malfunction. Other alarms may be directed to transport quality, e.g., high BER, loss of lock, BISS scrambling problems, among others.

B. MTR Inband Control

The MTRs 130, located proximate DVB-T modulators 136 that serve single frequency networks (SFNs) 140 are preferably remotely controllable with respect to at least some features. To achieve this, some DTF sites may include a user interface to allow parameters to be changed. This interface preferably has access to a database of MTR user addresses to allow targeted control of a single MTR, and a grouping methodology for targeting multiple MTRs at one time.

Not all DTF sites will have an operator present, so such sites may not have any In Band control stream, like stream 328 of FIG. 3C However, these sites may still need some fixed data. Such fixed data may be downloaded into the DTF 120 and thereafter be continuously transmitted.

The following describes the MPEG and DVB standard tables required as well as additional tables and descriptors that are employed in connection with inband control. The following discussion provides only an example of where inband control data may be placed. However, numerous other approaches may also be implemented, as will be appreciated by those skilled in the art.

As explained above, the MTR 130 has multiple RF inputs available. In one possible implementation, and as a default configuration, an MTR 130 may only receive the Inband Control Stream 328 on RF input 1 402, the primary input that typically also carries the National Feed. The assumption is that the National Feed will be present at all sites, so it makes sense to attach a global stream to this feed. Also, an Inband Control Computer (IBCC) 125 is only present in one site, e.g., a headend (not shown), and it makes the most sense that this would be the same site that originates the National Feed. Such a convention (using a predetermined RF input) places a wiring requirement at each receive site, but simplifies the overall installation of an MTR. The MTR may receive an Inband Control Stream on any RF port but all such streams must be consistent. Additionally, the MTR may receive an Inband Control Stream on all input ports but must employ a uniform scheme to select the active Inband Control Stream. In such cases, wiring installation is more flexible.

The following parameters are employed in a system consistent with embodiments of the present invention. Where MTRs are identified, the same applies to STBs unless otherwise noted.

Combined Transport Identifier
- Identifies a specific service that may carry a combined stream
- The combined stream may encapsulate a DVB-T stream or a standard MPEG-2 Transport
- Unique in the entire network
- Use the "Service Id" as the Combined Transport Identifier Carrier Identifier
- Identifies a DVB-S or DVB-S2 transport or transport containing combined streams.
- Use the "Transport Stream Id" as the Carrier Identifier Encryption Index
- Identifies which Session Words (SW) to use for descrambling a combined PID
- Each Encryption Index will reference one Even and one Odd SW
- Applies to all elementary stream PIDs in the associated PMT. There should only be one such ES PID referenced in a typical system PMT.
- The same Encryption Index may be used for all PIDs on the transport, but this is not a requirement for the system to work.
- The Encryption Index will be sent using a private descriptor in the program loop of the PMT.
- Support at least 128 SW
  - Pairs of Even and Odd SW in the MTR
  - The DTF may include a SW list the same as the MTR.
  - One SW for each scrambled combined transport may be used in the MTR.

Transport Name
- One for One uniqueness between the Transport Name and the Transport Identifier
- Identifies the Combined PID by a text name
- Maximum length as transmitted will be 50 bytes. This may be truncated to 23 bytes when displayed on an MTR front panel.
- Use the service name descriptor, as defined for the SDT, but place it in the PMT.

Target Id
- This is a 32 bit number, but is usually displayed in a 10-digit decimal "telephone" format with a checksum (e.g. 000-123-4567-5).

Target Group Id
- A single 16 bit number
- Number is assigned using the Target Id.
- An MTR may be a member of one or more groups.

IBC (inband control) may target multiple groups with one command.

An MTR is targeted if any of its assigned groups is listed in a command. This is an "OR" type of group assignment.

Tuning Parameters by Port

Complete list of tuning parameters is provided

A single EMM targets either a single MTR or a group of MTRs (An EMM simply means a targeted message, whether targeted to a single decoder or a group of decoders. In this system, EMM type messages are carried in the GDS PID, also known in this document as the In-Band Control Stream (IBC Stream)

If an IBC stream exists on multiple RF Ports, only the stream on the lower Port Number will be used Routing Options TS from specified Input port to ASI output As-is (RAW)

Pass only selected PIDs

Drop only selected PIDs

Decombine TS Input to ASI output

Sets the ASI output to receive data from a specified Combined Transport Identifier Assume the RF inputs to be defined such that the Combined Transport Identifier is available on one of the RF inputs, or else the ASI output mutes and generates an alarm A single EMM targets either a single MTR or a group of MTRs Similar to Pass, specify PIDs that STB are authorized to de-combine to access TS data Other routing options are not applicable to STBs ASI Output on/off Sets the ASI output to mute or non-mute Individual controls for each ASI output A single EMM targets either a single MTR or a group of MTRs Output Transport Bitrate For standard MPEG-2 transport streams that are not combined, this bitrate is the set output bitrate. PCR restamping and Null Packet insertions are allowed.

1. PSI/SI Specification

The PAT, PMT, and CAT are assembled using well-known utilities and then imported into the DTF 120. These tables are preferably included in all DTF outputs that contain one or more combined streams. Every combined stream is described by a single PMT.

1.1 PAT

Entry 0 points to the NIT PID (PID 16) assuming a NIT is being generated.

The remaining entries provide a list of PMT PIDs. The PIDs defined for the PMTs are arbitrary. No specific PID generation algorithm is required. For example, if Combined Identifier is limited to 1-999, then PMT PID may be Combined Id+5000.

1.2 CAT

In a stand alone DTF 120, there is no in-band control stream, so the CAT is present, but empty, as defined in the BISS standard.

For DTFs with an IBCC, the InBand Control Stream will be treated as an EMM stream (referred to as a "GDS"). This requires a Conditional Access Descriptor and a Global Control Descriptor to be present and pointing to the GDS PID. The Global Control Descriptor also requires a GDS Sub-Descriptor to identify the system to the MTR 130. This allows (possibly) multiple InBand Control Streams to be present, and the MTR 130 can resolve itself to a single InBand Control Stream.

The IBCC 125 may generate a CAT with both the CA and the GDS descriptors on PID 1 and the DCM/DTF passes this PID to the DCM/DTF output.

TABLE 1

GDS CA Descriptor

| Syntax | # Bits | Mnemonic |
|---|---|---|
| GDS_CA_descriptor( ) { | | |
| descriptor_tag = 0x09 | 8 | uimsbf |
| descriptor_length | 8 | uimsbf |
| CA_system_ID = 0x0E01 | 16 | uimsbf |
| ISO_reserved = '111' | 3 | bslbf |
| CA_PID == GDS_PID | 13 | uimsbf |
| for(i=0; i<N; i++) { | | |
| private_data_byte | 8 | uimsbf |
| } | | |
| } | | |

TABLE 2

Global Control Descriptor

| Syntax | # Bits | Mnemonic |
|---|---|---|
| global_control_descriptor( ) { | | |
| descriptor_tag = 0xFC | 8 | uimsbf |
| descriptor_length | 8 | uimsbf |
| CA_system_ID = 0x0E01 | 16 | uimsbf |
| ISO_reserved = '111' | 3 | bslbf |
| CA_PID == GDS_PID | 13 | uimsbf |
| for(i=0; i<N; i++) { | | |
| GDS_sub-descriptor( ) | | |
| } | | |

1.2.1 Global Control Descriptor Fields 1.2.1.1 Descriptor Tag

The value of this descriptor is defined as 0xFC, and is proprietary to Scientific-Atlanta ("SA"), the assignee of the instant application.

1.2.1.2 CA_system_ID

This is a global value that has been assigned by a regulatory agency within DVB. Once set, it identifies this table as being for SA. CA and should be hard coded into the system. SA has been assigned 256 values from 0x0E00 to 0x0EFF. All GDS will use the value of 0x0E01 to signal this as an SA stream.

1.2.1.3 GDS_PID

This is the PID carrying global control data. The generic name for the PID will be the GDS PID stream. Within a GDS PID stream are specific types of table sections. The stream of table sections will also have a name, such as the disaster recovery stream, the event control stream (ECS) or the storage control stream (SCS). In some architectures, multiple table streams may exist on a single GDS PID.

1.2.1.4 GDS Sub-Descriptors

In order to support multiple types of global data in the future, it is necessary to allow multiple types of streams to be defined for one PID. In a general remultiplexer, the device is able to search and remap a direct PID reference for the global data stream to a new value. But, most of these devices will not be able to handle multiple CA Descriptors that point to the same PID (i.e. they assume all CA descriptors point to a unique EMM stream, therefore duplicates are not allowed). The following section details the definition for sub descriptors that may be used in this loop to reference different GDS types. Any of these sub descriptors may exist within the global control descriptor multiple times if many different instances of a stream exist on one PID. The only limitation is that the CA Descriptor itself is limited to a total of 256 bytes.

1.2.2 GDS Type Sub-Descriptor

TABLE 3

GDS Type Sub-Descriptor

| Syntax | # Bits | Mnemonic |
|---|---|---|
| GDS_Type( ) { | | |
|     type_tag | 8 | uimsbf |
|     type_length = 4 | 8 | uimsbf |
|     customer_code | 16 | uimsbf |
|     GDS_Id | 16 | uimsbf |
| } | | |

1.2.2.1 Type Tag

Defined sub-descriptor tags are shown in Table 4. Each type tag indicates which of the configured systems' "Id" to use as a filter. Sometimes, it may be desirable to transmit multiple systems on one PID, so multiple different Id values may exist. Some sub-systems will not require an ID value, so they will be hard coded with a value. When an additional filter is required, an EMM can be defined and delivered the Id to the MTR.

TABLE 4

Sub-Descriptor Tags

| Tag | Description | GDS_Id | Hardcoded Value |
|---|---|---|---|
| 0x01 | reserved | | |
| 0x02 | reserved | | |
| 0x03 | reserved | | |
| 0x04 | In-Band Control System | IBC_Id | Not hardcoded |
| 0x05-0xFF | reserved | | |

1.2.2.2 Customer Code

This field allows the decoder to locate an IBC stream in the GDS that has a specific customer code.

1.2.2.3 GDS_Id

This field allows the MTR to locate a specific type of GDS. The GDS_Id field is a placeholder for a specific type of GDS_Id, which depends on the sub_descriptor_tag_type. Table 4 lists the name of the specific GDS_Id for each tag_type. For the MTR, we use the IBC_Id type of GDS Stream.

1.3 PMT

Each PMT is placed on a separate PID.

Each PMT contains a single elementary stream loop, with the PCR PID being set to NULL (0x1FFF) and the ES PID pointing to the associated combined PID.

The Program Descriptor Loop contains the following:

A Conditional Access Descriptor indicating BISS Scrambling (CA System Id=0x2600). Only present if the PID is scrambled.

A Service Name descriptor to define the Transport Name.

The Elementary Stream Descriptor Loop contains the following:

Private Stream Type 0x90 to define a Combined Stream

A proprietary descriptor to define the encryption index.

A proprietary descriptor to define the bitrate.

1.3.1 MTR Control Descriptor

TABLE 5

MTR Control Descriptor

| Syntax | # Bits | Mnemonic |
|---|---|---|
| MTR_Control_descriptor( ) { | | |
|     descriptor_tag = 0xFB | 8 | uimsbf |
|     descriptor_length | 8 | uimsbf |
|     encryption_index | 16 | uimsbf |
|     output_bitrate | 32 | uimsbf |
| } | | |

1.3.1.1 Descriptor Tag

This is the tag that identifies the descriptor.

1.3.1.2 Descriptor Length

This is the length of the data in the descriptor, following this length field.

1.3.1.3 Encryption Index

This value indicates which control word should be used for descrambling the associated combined PID.

Values indicate which scrambling key pair to use for descrambling the combined PID.

The PMT includes a CA Descriptor (using the BISS CA System Id) to indicate that the combined PID is scrambled.

1.3.1.4 Output Bitrate

This unsigned value indicates the bitrate of the decombined stream in bits per second.

1.4 NIT

The NIT carries a loop defining each Transport Stream Id, which is the unique identifier of the tuning parameters.

Only the Transport Stream Id is assigned to each port and the NIT is used to determine the actual tuning parameters.

Customizable defaults are used to setup the initial transport stream used to locate the tuning parameters for the system.

The MTR can scan the NIT and store the parameters for future use.

The IBCC preferably sends an EMM to control how the MTR should respond to a NIT. When this flag is set, the MTR will use the NIT to follow any changes in the frequency plan that a customer may make. When this flag is clear, the MTR uses the stored frequency information until manually reconfigured.

The service list descriptor should be present. This allows the NIT to describe all combined transports in the network.

The Network Name Descriptor should be present. It provides a name for the DVB-S/DVB-S2 carrier and can be displayed to the user when assigning tuning parameters to an RF input using the MTR's user interface.

There should be at most one NIT in this system. The Original Network Id should always equal the Network Id. The MTR can be set to a load a specific Network Id. This prevents accidental loss of network parameters if a user tunes the MTR manually to an incorrect frequency.

1.5 SDT

If the SDT is sent, the Actual SDT is preferably sent along with all of the Other SDT. This permits a description of all combined transports in the network.

With the SDT present, the Service Name Descriptor can be placed in its correct location in standard DVB systems, rather than in the PMT.

The SDT indicates the scrambled state of the service. Like the PMT, the scrambled flag and CA Identifier should be present only when BISS is applied to the service.

The IBCC preferably generates this table but it is not a system requirement. Sending the SDT makes the stream more DVB compliant.

1.6 TDT

The MTR 130 requires a TDT to accurately record timestamps in its various log files.

2. Inband Control Specification

2.1 Common Control Syntax

Table 6 below gives the syntax for a section, for tables defined within this specification.

TABLE 6

Common Control Syntax

| Syntax | # Bits | Mnemonic |
|---|---|---|
| common_control_section( ) { | | |
|   table_id | 8 | uimsbf |
|   section_syntax_indicator = '1' | 1 | bslbf |
|   SA_reserved = '1' | 1 | bslbf |
|   ISO_reserved='11' | 2 | bslbf |
|   section_length | 12 | uimsbf |
|   Id | 16 | uimsbf |
|   ISO_reserved='11' | 2 | bslbf |
|   version_number | 5 | uimsbf |
|   current_next_indicator | 1 | bslbf |
|   section_number | 8 | uimsbf |
|   last_section_number | 8 | uimsbf |
|   customer_code | 16 | uimsbf |
|   reserved = 0 | 4 | |
|   major_loop_length | 12 | uimsbf |
|   for(i=0; i<N; i++ ) { | | |
|     reserved = 0 | 4 | uimsbf |
|     address_loop_length | 12 | uimsbf |
|     for(i=0; i<N; i++) { | | |
|       address_descriptor( ) | * | |
|     } | | |
|     reserved = 0 | 4 | uimsbf |
|     action_loop_length | 12 | uimsbf |
|     for(i=0; i<N; i++) { | | |
|       action_descriptor( ) | * | |
|     } | | |
|   } | | |
|   CRC_32 | 32 | rpchof |
| } | | |

2.1.1 CCS Header

2.1.1.1 Table Id

The table id to use depends on the type of section being generated, as shown in Table 7

TABLE 7

Table ID Definitions

| Table Id | Name | Acronymn | Id |
|---|---|---|---|
| 0xF7 | MTR_inband_control_section | MCT | IBC_Id |
| 0xF8 | MTR_information_section | MIT | IBC_Id |
| 0xF9 | MTR_addressed_section | MAT | IBC_Id |

2.1.1.2 Section Length

The length of a section on the Global Data Stream may be up to the maximum allowed size of 4096 bytes. This field would then be limited to a maximum value of 4093.

The MTR sections may grow to the full size allowed, and also may require multiple sections to transmit all of the data.

2.1.1.3 Id

These messages are usually targeted to a set of groups that should immediately act on the list of actions. The table to act on is identified by matching the customer_code and Id. Each complete table is identified by the Id, using standard MPEG rules. Therefore, the Id is preferably unique for every unique table type in a network. All sections within a table preferably have the same Id (by definition of a table) and preferably also have the same Customer Code.

2.1.1.4 IBC Id

The IBC_Id identifies this GDS as delivering MTR inband control messages for a specific network provider. The IBC_Id is only used if multiple IBC streams are accessible to an MTR. Any one MTR will process, at most, one Inband Control Stream.

2.1.1.5 Version Number

The version_number of all sections change together.

2.1.1.6 Current Next Indicator

This field is always set.

2.1.1.7 Section Numbers

If the section becomes very large, then the normal MPEG section mechanism can be used to split the table into smaller messages.

2.1.1.8 Customer Code

This field identifies a network operator uniquely. The MTR can then determine if the Id is applicable or not

2.1.1.9 Major Loop Length

This gives the number of bytes in the following loop.

2.1.1.10 Address Loop Length

This field gives the total number of bytes used by all of the descriptors in the Address Descriptor Loop.

2.1.1.11 Address Descriptors

These descriptors follow the general syntax of MPEG-2 descriptors, but these descriptors are only used within the context of the common syntax messages within the address descriptor loop. The descriptor tags will not be coordinated with tags from any other standard, such as MPEG, DVB or ATSC.

2.1.1.12 Action Loop Length

This field gives the total number of bytes used by all of the descriptors in the Action Descriptor Loop.

2.1.1.13 Action Descriptors

These descriptors follow the general syntax of MPEG-2 descriptors, but these descriptors are only used within the context of the common syntax messages within the action descriptor loop. The descriptor tags will not be coordinated with tags from any other standard, such as MPEG, DVB or ATSC.

2.2 Common Descriptor Definitions

2.2.1 Address Descriptors

The following table summarizes the address and action descriptors that may be used in a CCS. Multiple different descriptors may exist in one message. When multiple descriptors are present, they are executed in the order that they exist in the table. The BOLD entries indicate descriptors used for In-Band control.

TABLE 8

Address Descriptor Summary

| Descriptor Tag | Descriptor Name | Used in . . . | Description |
|---|---|---|---|
| 0x00 | global_addressed | MIT | Targets all decoders for the listed actions. |
| 0x02 | simple_group_addressed | MCT | Allows groups of decoders to be targeted for an action. |
| 0x03 | individual_addressed | MAT | Allows single decoders to be targeted for an action |

TABLE 8-continued

Address Descriptor Summary

| Descriptor Tag | Descriptor Name | Used in... | Description |
|---|---|---|---|
| 0x04-0x3F | Reserved | | Reserved for future use |
| 0x40-0xFF | | | See Action Desciptors |

2.2.1.1 Global Addressed Descriptor

This descriptor is used when a set of action descriptors are intended for all decoders. This type of addressing is use to download a complete set of information for all combined streams on all frequencies.

2.2.1.2 Simple Group Addressed Descriptor

This descriptor provides a small descriptor that addresses a group of decoders in the system. If multiple groups are to perform the same action, then multiple of these descriptors may be present. This descriptor may be combined with individual addressed descriptors. If an MTR has multiple target_group_ids defined, it will process the associated action descriptors in any of its target_group_ids matches.

TABLE 9

Simple Group Addressed Descriptor

| Syntax | # Bits | Mnemonic |
|---|---|---|
| simple_group_addressed_descriptor( ) { | | |
| descriptor_tag = 0x02 | 8 | uimsbf |
| descriptor_len = 0x02 | 8 | uimsbf |
| target_group_id | 16 | uimsbf |
| } | | |

2.2.1.2.1 Descriptor Tag

This is the tag that identifies the descriptor. The value is defined in Table 8.

2.2.1.2.2 Descriptor Length

This is the length of the data in the descriptor, following this length field.

2.2.1.2.3 Target Group Id

This value defines the group of MTRs being addressed. A value of zero is reserved to mean "No Group Defined". A value of zero is used in the MTR to indicate entries that are not defined.

2.2.1.3 Individual Addressed Descriptor

This descriptor provides a descriptor that addresses a single decoder in the system. If multiple groups are to perform the same action, then multiple of these descriptors may be present. This descriptor may be combined with simple group addressed descriptors.

TABLE 10

Individual Addressed Descriptor

| Syntax | # Bits | Mnemonic |
|---|---|---|
| individual_addressed_descriptor( ) { | | |
| descriptor_tag = 0x03 | 8 | uimsbf |
| descriptor_len = 0x04 | 8 | uimsbf |
| user_address | 32 | uimsbf |
| } | | |

2.2.1.3.1 Descriptor Tag

This is the tag that identifies the descriptor. The value is defined in Table 8.

2.2.1.3.2 Descriptor Length

This is the length of the data in the descriptor, following this length field.

2.2.1.3.3 User Address

This value defines an individual MTR being addressed.

2.2.2 Action Descriptors

The following table summarizes the address and action descriptors that may be used in an MCT. Multiple different descriptors may exist in one message. When multiple descriptors are present, they are acted on in the order that they exist in the table. The BOLD entries indicate descriptors used for In-Band control. The other descriptors are shown for completeness.

TABLE 11

Action Descriptor Summary

| Descriptor Tag | Descriptor Name | Used in... | Description |
|---|---|---|---|
| 0x40 | no_action | ALL | |
| 0x41-0x7F | reserved | | Future use. |
| 0x80 | RF_port_assignment | MAT/MCT | RF Port Assignment |
| 0x81 | ASI_output_control | MAT/MCT | ASI Output Setup (Routing & Enable) |
| 0x82 | group_assignment | MAT | Assign a Target Group Id to an MTR |
| 0x83 | stream_info | MIT | Lists each combined stream's information |
| 0x84 | reserved | MIT | Future use |
| 0x85-0xFF | Reserved | | Future use |

2.2.2.1 RF Port Assignment Descriptor

This descriptor is used to assign a set of RF Parameters to an RF Input. The current MTR is designed with 4 RF inputs and one ASI input. This descriptor is designed to support additional future RF ports.

TABLE 12

RF Port Assignment Descriptor

| Syntax | # Bits | Mnemonic |
|---|---|---|
| RF_port_assignment( ) { | | |
| descriptor_tag | 8 | uimsbf |
| descriptor_len | 8 | uimsbf |
| RF_input | 8 | uimsbf |
| transport_stream_id | 16 | uimsbf |
| local_control_flag | 1 | bslbf |
| reserved = 0 | 7 | '000 0000' |
| } | | |

2.2.2.1.1 Descriptor Tag

This is the tag that identifies the descriptor. The value is defined in Table 11.

2.2.2.1.2 Descriptor Length

This is the length of the data in the descriptor, following this length field.

2.2.2.1.3 RF Input

This value defines the RF input being assigned a value. A value of zero is reserved and is not used. A value of 1 to N indicates the RF inputs. Values above N are reserved for future use. The current definition for N is 4.

2.2.2.1.4 Transport Stream Id

This value assigns the port's RF parameters by referencing the parameters associated with a specific entry in the NIT. In terms of the IBCC, the transport stream id is being called the Carrier_Id.

2.2.2.1.5 Local Control Flag

When set, this field indicates that the MTR user may use the front panel to change the RF settings.

When clear, the user may not change the settings locally. The settings are always controlled by this action descriptor.

2.2.2.2 ASI Output Control Descriptor

This descriptor is used to control how the ASI output operates. The current MTR is designed with 6 ASI outputs. This descriptor is designed to support additional future ASI output ports. One descriptor describes one ASI Output, and a complete description is preferably able to fit in one descriptor. This implies a maximum length for the number of PIDs. The ASI Output number may exist, at most, once per EMM.

With a fully populated PID list, 16 PID entries defined, this descriptor uses 41 bytes per ASI output.

TABLE 13

ASI Output Control Descriptor

| Syntax | # Bits | Mnemonic |
|---|---|---|
| ASI_output_control( ) { | | |
| descriptor_tag | 8 | uimsbf |
| descriptor_len | 8 | uimsbf |
| ASI_Output | 8 | uimsbf |
| enable_flag | 1 | bslbf |
| raw_input_flag | 1 | bslbf |
| decombine_output_flag | 1 | bslbf |
| output_DVB-T_flag | 1 | bslbf |
| pid_filter_pass_flag | 1 | bslbf |
| local_control_flag | 1 | bslbf |
| reserved = 0 | 2 | '00' |
| transport_id | 16 | uimsbf |
| port_number | 8 | uimsbf |
| output_bitrate | 32 | uimsbf |
| num_pids | 8 | uimsbf |
| for(i=0; i<N; i++) { | | |
| reserved = 0 | 3 | '000' |
| PID | 13 | uimsbf |
| } | | |
| } | | |

2.2.2.2.1 Descriptor Tag

This is the tag that identifies the descriptor. The value is defined in Table 11.

2.2.2.2.2 Descriptor Length

This is the length of the data in the descriptor, following this length field.

2.2.2.2.3 ASI Output

This value defines the ASI output being assigned a value. A value of zero is not allowed. A value of 1 to 6 indicates the available outputs. Values above six are reserved for future use.

2.2.2.2.4 Enable Flag

When set, this indicates that the associated ASI output is enabled. When clear, this indicates that the associated ASI output is disabled and muted. When Mute Output is set, the Enable Flag will be clear.

2.2.2.2.5 Raw Input Flag

When set, this indicates that the associated ASI output passes all PIDs from the input to the output, with possible PID filtering applied. When clear, this indicates that the associated ASI output gets its data from a single combined stream. When this flag is set, the Decombine Output Flag must be clear.

When an input is flagged as raw, then the PID filters may be applied.

For "Pass All Pids", this indicated by clearing the PID Filter Pass Flag and leaving the PID Filter List empty.
For "Drop PID List", this is indicated by clearing the PID Filter Pass Flag and providing the list of PIDs to drop.
For "Pass PID List", this is indicated by setting the PID Filter Pass Flag and providing the list of PIDs to pass.

2.2.2.2.6 Decombine Output Flag

When set, this indicates that the associated combined PID is decombined. When clear, this indicates that the associated combined PID is output as-is (i.e., it remains combined). When this flag is set, the Raw Input Flag must be clear.

2.2.2.2.7 Output DVB-T Flag

When set, this indicates that the associated ASI output is used for DVB-T applications. No modification of any bits in this stream is allowed. When clear, this indicates that the associated ASI output is used for standard MPEG-2 transports. This mode allows PCR restamping, Null Packet Insertion, and the Output Bitrate can be used to set a specific bitrate. This flag only has meaning when the Decombine Output Flag is set.

2.2.2.2.8 PID Filter Pass Flag

When set, this indicates that the PID list provided indicates the PIDs allowed to pass through to the output. All other PIDs are dropped. When clear, this indicates that the PID list provided indicates the PIDs that are dropped from the output. All other PIDs are passed.

2.2.2.2.9 Local Control Flag

When set, this field indicates that the MTR user may use the front panel to change the ASI Output controls manually. When clear, the user may not change the settings locally.

2.2.2.2.10 Transport Identifier

This value indicates the Transport Identifier of the PID to decombine and send out this ASI output port. If the Transport Identifier is not found in the NIT, the output is muted. If the RF Input Port for the Transport Identifier selected is not currently assigned, then mute the ASI output. In MPEG terminology, this would be called the Service Id. In the context of the present invention, this is called the Combined Transport Identifier.

2.2.2.2.11 Port Number

This value indicates the RF Input Port Number to use when locating the Transport Identifier (Combined Transport Identifier). This is only needed if the same tuning parameters have been assigned to multiple RF ports, and the user wants to use a specific port for normal operation. A value of zero is not allowed. A value of 1 to N defines the specific RF input to use. If the Transport Identifier is not found on this port, the output is muted, even if it could have been found on another RF port. A value of N+1 and up will mute the associated ASI output. (i.e. selecting a non-existent RF Input).

2.2.2.2.12 Output Bitrate

When Output DVB-T Flag is clear, this field carries the output bitrate for the decombined stream. If Output DVB-T Flag is set or this field is zero, the user may set the rate or the internally measured rate is used.

2.2.2.2.13 Num PIDs

This field indicates the number of loops to follow.

2.2.2.2.14 PID

This is a standard 13-bit PID field. This field is inside a loop, and provides a list of up to 16 PIDs that may be passed or dropped on the ASI Output. The PID Filter Type Flag defines whether the list is a "Pass" list or a "Drop" list.

2.2.2.3 Group Assignment Descriptor

This descriptor is used to assign a Target Group Id to an MTR. This allows future Grouped EMM messages to be sent to this MTR. This descriptor is intended to be used with individually targeted EMMs, but (in theory) could be used to change all decoders in a group to a different group.

TABLE 14

Group Assignment Descriptor

| Syntax | # Bits | Mnemonic |
|---|---|---|
| group_assignment( ) { | | |
|     descriptor_tag | 8 | uimsbf |
|     descriptor_len | 8 | uimsbf |
|     for(i=0; i<N; i++) { | | |
|         target_group_id | 16 | uimsbf |
|     } | | |
| } | | |

2.2.2.3.1 Descriptor Tag

This is the tag that identifies the descriptor. The value is defined in Table 11.

2.2.2.3.2 Descriptor Length

This is the length of the data in the descriptor, following this length field.

2.2.2.3.3 Target Group Id

This value defines the list of group being assigned an MTR. The current design allows any one MTR to have up to 10 target_group_ids.

2.2.2.4 Stream Information Descriptor

This descriptor is used to download the information for all combined transports in the network. This information is also carried for each combined transport using the PMT. There is at least one descriptor per transport stream id. It is possible, if the combined transport names are long, that multiple descriptors per transport stream id may be required to describe all of the combined PIDs.

TABLE 15

Stream Information Descriptor

| Syntax | # Bits | Mnemonic |
|---|---|---|
| stream_information( ) { | | |
|     descriptor_tag | 8 | uimsbf |
|     descriptor_len | 8 | uimsbf |
|     transport_stream_id | 16 | uimsbf |
|     for(i=0; i<N; i++) { | | |
|         transport_identifier | 16 | uimsbf |
|         transport_name_length | 8 | uimsbf |
|         for(i=0; i<N; i++) { | | |
|             transport_name_byte | 8 | |
|         } | | |
|     } | | |
| } | | |

2.2.2.4.1 Descriptor Tag

This is the tag that identifies the descriptor. The value is defined in Table 11.

2.2.2.4.2 Descriptor Length

This is the length of the data in the descriptor, following this length field.

2.2.2.4.3 Transport Stream Id

This defines the transport stream being identified by this loop within the descriptor. A transport_stream_id is unique per frequency (i.e. per transport) within the entire network. Any one descriptor must carry a complete descriptor for each service, or else a new descriptor must be started. This implies that a complete description of a transport may be split over multiple descriptors.

2.2.2.4.4 Combined Transport Identifier (Service Id)

This identifies one combined stream within the transport stream. The list of Combined Transport Identifiers must be unique within the entire network. The Combined Transport Identifier is technically the same as the Service Id found in a PMT pointing to a combined PID.

2.2.2.4.5 Transport Name Length

This field gives the total length, in bytes, of the Combined Transport Name, as carried in the following loop. The entire Combined Transport Name must be contained within one descriptor.

Code Download Support

Introduction

As an added feature, the Inband Control Computer (IBCC) 125 could be designed to load and send a Code Download to the MTR. This is an optional feature. The following is intended to document how Code Download could be supported.

File Format

The IBCC 125 would load a file that is a simple image of CDT sections. There are no additional headers present in this file. The IBCC 125 can verify the integrity of the file using the MPEG-2 Section headers and Section CRC-32 fields. Once the file is loaded into memory, the sections are packetized onto a user defined PID, and may be carouselled out in the same manner as the (inband control) IBC data itself.

Code Download Signaling

Code downloads are signaled in the PMT using a well-known stream type. Typically, the code download stream PID is defined in every PMT. In this application, the IBC sends a code download action descriptor that is targeted to all MTRs in the network. The MTR determines if the code download is required using the code version and other parameters transmitted in the descriptor.

C. DTF-MTR Protocol Signaling

1. Introduction

As previously mentioned, the purpose of the DTF 120/MTR 130 combination is to convey one or more Multi-Program Transport Stream (MPTS) or Single Program Transport Stream (SPTS) source streams as embedded private data inside another DVB-S or DVB-S2 multiplex, and to play out the original stream cleanly from the MTR 130 after a fixed latency. An entire source stream is combined into a single PID stream for output from the DTF 120. This output PID is called the combined PID. It should be clear from the context when reference is being made to either the PID (a 13-bit value) or the data stream contained in packets stamped with this PID. The multiplexing of several combined PID's that occurs naturally in the DTF 120 introduces substantial instantaneous jitter in the arrival time of the packets containing any given combined source stream. A system using timestamps inside the combined PID is proposed to allow clean recovery of the original stream, despite any multiplexing jitter.

Data to allow the MTR 130 to perform more robust loss-of-stream error recovery is also signaled in the combined PID. Error-recovery data is sent in both the priority bit of the transport packet and in the private data of the combined PID's transport packet adaptation field.

1.1 Timing Outline

The system uses PCR's in the combined PID to send a copy of the DTF-local SCR to the MTR 130. Periodically, the DTF arrival times of packets in the original source stream are time-stamped against this SCR and these timestamps are transmitted in the combined PID as well. The MTR 130 compares these source timestamps to the reconstructed SCR to adjust the playout rate of the source stream. These source stream timestamps (STS's) are conveyed in the adaptation field private data of the combined PID.

The final result is that the MTR 130 is able to use both the PCR's and the source timestamps to implement a constant wall-clock delay from DTF input to MTR output, providing a transparent end-to-end, low jitter path for the source data. The system works with standard MPEG PCR-corrected remuxing of the DTF output, allowing the DTF output to be transmitted using a standard DVB-S or DVB-S2 modulator. For simplicity, the PCR and STS samples as well as error recovery data are preferably combined into a single fixed-length adaptation field in the combined PID.

1.2 Error Recovery Data Outline

Also defined is extra data transmitted by the DTF 120 to allow improved error handling in the MTR 130. This extra data is sent in two paths: by taking over the unused priority bit in the transport stream header, and also by making use of the ISO 13818-1 defined transport stream adaptation field private data.

The priority bit carries two bits of time-division multiplexed data: an extended continuity counter bit and an adaptation field detection assistance bit. These allow the MTR 130 to infer more precisely how many bytes of source stream data have been lost during short-term packet loss events, and are described more fully in section 5. This inference allows more rapid and robust error concealment.

The adaptation field private data carries two items of data to help the MTR 130 resynchronize after a loss of signal or packet drop. The first item is a source stream packet counter which allows the MTR 130 to infer the exact number of lost source packets during a longer loss of signal event. The second item is the exact byte offset of the source sync byte in the combined PID packet, which allows the MTR's de-combiner to recover sync byte alignment without needing a statistical parsing stage.

There is a certain amount of redundancy in the two paths, but the priority bit data is primarily used to help recover from a short-term packet loss, while the adaptation field data helps to recover from a longer loss.

2. Background—DTF Operation

The DTF combines (using a packet encapsulation process) and buffers (through a round-robin multiplexing) a number of input source streams, such as TS1, TS2, etc shown in FIG. 3A. Each source stream (typically either an SPTS or MPTS) will have an independent, but identical implementation of the signaling mechanism and PCR/STS timestamp logic described herein. As explained in connection with FIGS. 3A-C, each channel packet contains a portion of the source stream in its payload—the DTF 120 is combining, not just performing a simple packet multiplexing operation.

For each source stream, the stream is encapsulated (here, called combining) by putting 184 bytes of source data (or 164 bytes when a particular 20-byte adaptation field is inserted) into each carrier packet. This results in approximately a 46 source packet to 47 (or 51) carrier packet ratio, although the ratio is not exact due to the overhead incurred by variable rate insertion of the adaptation fields. Each output stream is assigned a unique multiplexed PID.

Note that the adaptation field insertion rate is not tied to the source stream bit rate; so that it is not possible to determine the exact number of source stream bytes carried in a fixed number of consecutive combined PID packets unless the number of adaptation fields in the section is also known. This simplifies timing recovery at the expense of error recovery complexity.

The DTF 120 preferably comprises user-accessible controls to selectively enable or disable adaptation field signaling, priority bit signaling, and to set adaptation intervals for testing and tuning purposes. The DTF 120 supports intervals in at least the range 10-500 ms in 10 ms or better resolution for testing.

The recommended adaptation insertion interval is 40 ms. This insertion frequency will add 4 kbit/s to the channel PID rate, or 0.04% overhead at a source stream rate of 10 Mbit/s.

3. Timing System

Figure 5:
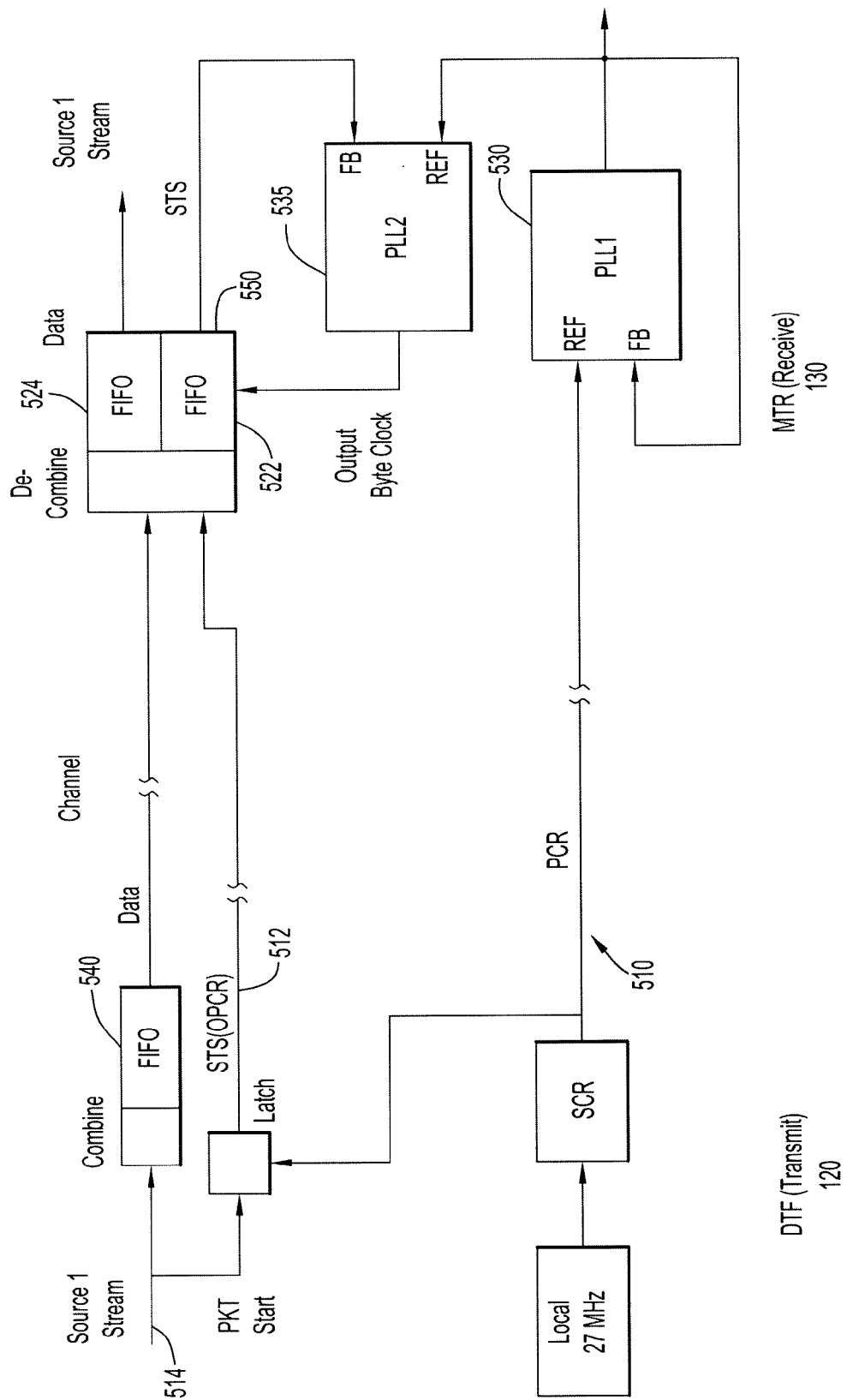
FIG. 5 shows a logical structure of a timing system in accordance with embodiments of the present invention.

FIG. 5 shows a logical structure of a timing system in accordance with embodiments of the present invention. The timing scheme consists of two layers: a lower level SCR layer 510, and a source timestamp (STS) layer 512 which references the timing of the original source stream 514 to the SCR layer 510.

The timing information is sent at fixed intervals in the combined PID transport adaptation field. The adaptation field also contains error-recovery data, and the adaptation field is preferably a constant length of 20 bytes. At very low bit rates, there may be almost as many adaptation fields with timing data as there are source packets, while at high rates, the associated timestamp FIFOs 522 in the DTF 120 and 540 in MTR 130 may be empty most of the time.

3.1 SCR Timing Layer

The lowest level of timing is the SCR layer 510. PCR's are sent in the adaptation field of the combined PID at regular intervals to allow the MTR 130 to reconstruct a copy of the SCR. This is the job of phase lock loop (PLL) PLL1 530, an all-digital version of a conventional decoder PCR recovery loop. The SCR layer 510 follows the structure of the normal MPEG-2 PCR mechanism, except that this PCR is not necessarily related to any of the PCR's carried inside the original MPTS or SPTS source stream. In the preferred embodiment, the PCR recovery can be performed with minimal or no involvement from the MTR's host microprocessor.

3.2 STS Timing Layer

The source layer timing 512 operates on source timestamps (STS's). The DTF 120 input stage captures a source timestamp of the SCR at the arrival time of a source packet. At periodic intervals, when an adaptation field is open in the combined PID packet, the STS associated with the most recently transmitted source stream sync byte is copied into the adaptation field. This implies that the DTF 120 has some means of keeping track of the correspondence between STS samples and packet start codes in its combiner and multiplexing FIFO 540.

The MTR 130 implements a phase locked loop (PLL2) 535 which acts to keep the delay through the system constant by modulating the MTR FIFO's 524 output rate. It measures the system latency by taking a snapshot of the MTR's recovered SCR at the time of exit of a suitably stamped source packet, and comparing it to the transmitted STS that was associated with that packet. After subtracting the expected constant system latency L, this becomes the phase detector output which drives the loop filter and digital VCO of PLL2 535.

To implement this PLL 535 in the MTR 130, the MTR 130 must have a means of associating the STS values in the STS FIFO 522 with the proper packet sync byte in the main packet FIFO 524.

The STS output FIFO 522 is synchronized to the data output FIFO 524 such that the STS appears at the output of the FIFO at exactly the same time as the corresponding packet start code exits the data FIFO and appear at the Source Stream 1 output as shown in FIG. 5. The corresponding packet refers to that packet to whose start code the STS in the next transmitted adaptation field was associated. This synchronized timing allows the STS to be used as feedback to the PLL2 phase locked loop 535.

3.3 STS Sampling and Latency

It should be evident that, in order to use the STS as a measure of the wall-clock end-to-end system delay, the STS must be sampled at the immediate point of source stream entry into the DTF 120 and must be used to capture a PLL feedback sample at the final point of exit 550 of the source stream from the MTR 130. Since these samples are always taken at source stream packet start points, the exact values of the timestamps are independent of the DVB-ASI EN 50083-9 Appendix B layer 2 data mode (data packets or data bursts). The source stream data is expected to arrive at the DTF 120 with evenly-spaced transport packet sync bytes, and if this is not the case, extra jitter will be present in the measured STS values.

The system latency L is derived by the MTR 130 as a function of the expected worst-case packet jitter due to the DTF combining and multiplexing. The MTR software can calculate L to be on the order of the 27 MHz equivalent time of some fixed number of packets at the measured or signaled bitrate. This fixed number could for example denote the expected half-full occupancy of the MTR data output FIFO 522. The DTF 120 is not required to add any compensation or offset to the STS as long as its worst case delay does not change from this fixed upper limit. In a typical embodiment this fixed value could be on the order of 16 to 128 packets, depending on the expected jitter.

4. Adaptation Field Structure

Figure 6:
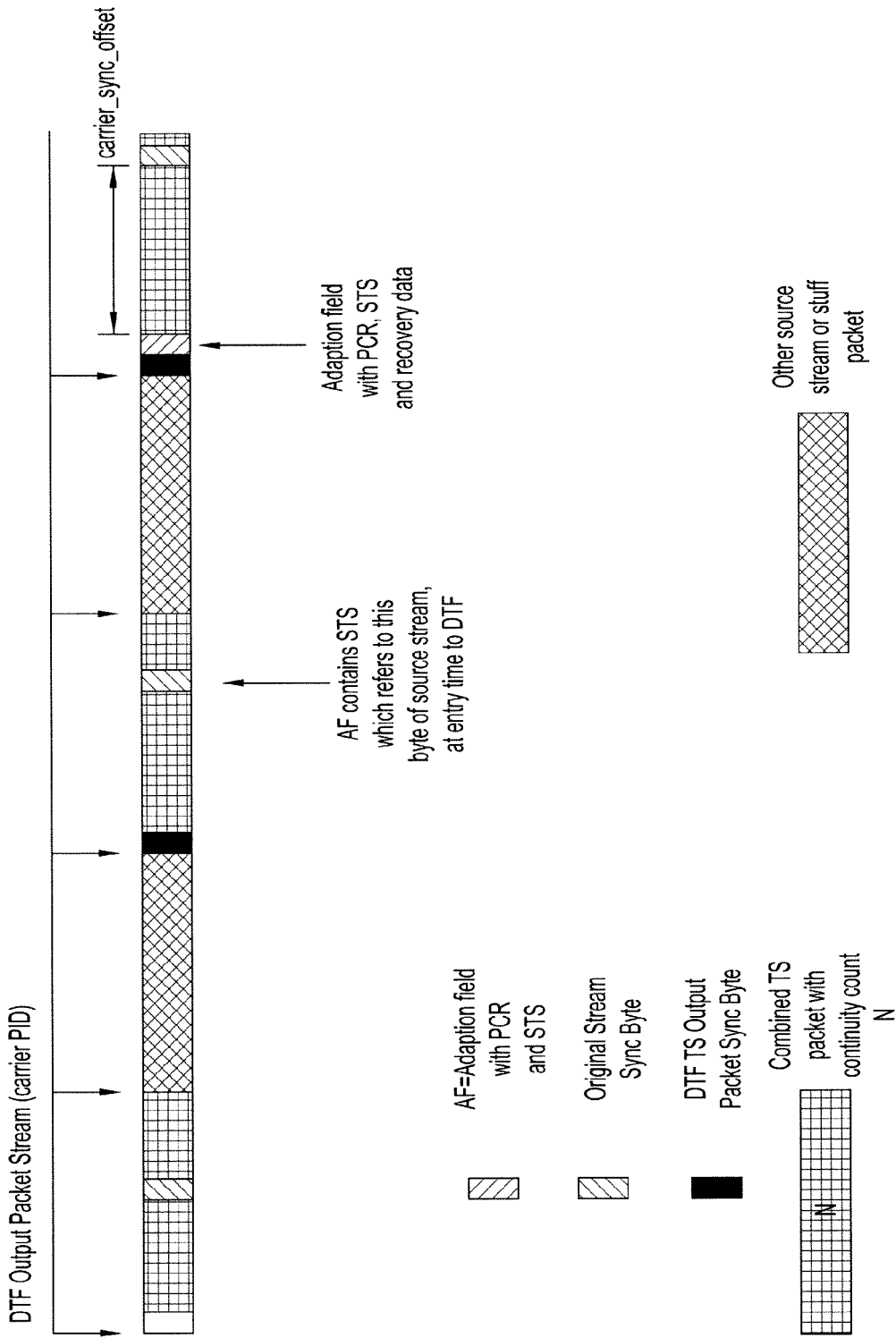
FIG. 6 shows the location of source sync bytes in accordance with an embodiment of the present invention.

Each adaptation field inserted by the DTF 120 has a fixed length of 20 bytes. The length must be fixed, and is a multiple of four bytes. The adaptation field has the following structure:

source stream PID. The value is associated with the same source stream sync byte offset referenced by the combiner_sync_offset.

combiner_sync_offset—an 8 bit value in the range [0 . . . 187] (the range will be [0 . . . 203] if 204-byte source stream packets are being carried in their entirety by the combined PID payload) which denotes the number of combined PID payload bytes following this adaptation field but before the next source stream sync byte. This parameter assists the MTR in identifying sync byte location for purposes of more direct synchronization. Examples:

if the first payload byte is a source stream sync byte, the value of this field is 0 if the sync byte is the last byte of this packet's payload, the value of this field is 163. (After a 20 byte adaptation field and 4 byte fixed transport packet header, there are 164 payload bytes.)

if there is no sync byte in this packet, but one is located in the second payload byte of the following combined PID packet, the value would be 165 in FIG. 6 the source sync byte following the adaptation field is almost but not quite at the end of the combined

| Adaptation Field Structure | | | |
|---|---|---|---|
| Syntax | Comment | No. of Bits | Menemonic |
| adaptation_field( ) { | | | |
|   adaptation_field_length | /* always 19 */ | 8 | Uimsbf |
|   discontinuity_indicator | /* always 0 */ | 1 | Bslbf |
|   random_access_indicator | /* always 0 */ | 1 | Bslbf |
|   elementary_stream_priority_indicator | /* always 0 */ | 1 | Bslbf |
|   PCR_flag | /* always 1 */ | 1 | Bslbf |
|   OPCR_flag | /* always 0 */ | 1 | Bslbf |
|   splicing_point_flag | /* always 0 */ | 1 | Bslbf |
|   transport_data_private_flag | /* always 1 */ | 1 | Bslbf |
|   adaptation_field_extension_flag | /* always 0 */ | 1 | Bslbf |
|   program_clock_reference_base | /* PCR */ | 33 | Uimsbf |
|   Reserved | | 6 | uimsbf |
|   program_clock_reference_extension | | 9 | uimsbf |
|   transport_private_data_length | /* always 11 */ | 8 | uimsbf |
|   STS_base | | 23 | uimsbf |
|   STS_extension | | 9 | uimsbf |
|   source_stream_continuity_count | | 16 | uimsbf |
|   combiner_sync_offset | | 8 | uimsbf |
|   source_packet_size | | 1 | uimsbf |
|   Reserved | /* always 0 */ | 7 | uimsbf |
|   Reserved | /* always 0 */ | 8 | uimsbf |
|   Reserved | /* always 0 */ | 8 | uimsbf |
|   Reserved | /* always 0 */ | 8 | uimsbf |
| } | | | |

The fields listed in the table above are all standard MPEG-2 fields as described in ISO 13818-1:1994(E), section 2.4.3.4, except for the following:

STS_base—the base 23 bits of the STS timestamp. STS_base is sampled from, and is in the same 90 kHz units as, the SCR base counter which provides PCR_base, but with the most significant 10 bits of the 33-bit PCR_base discarded. The units, scaling, and reference of STS_base corresponds to the 23 lower bits of the PCR_base.

STS_extension—the extension 9 bits of the STS timestamp, sampled from, and in the same 27 MHz units as, the SCR modulo-300 counter which provides PCR_extension. This value is always in the range [0:299]. The units, scaling, and reference of STS_extension are the same as those which produce PCR_extension.

source_stream_continuity_count—a 16 bit counter which increments for every source stream packet, regardless of the PID payload. Hence the signaled combiner_sync_offset would be close to but slightly less than 163 source_packet_size—a 1 bit field indicating the size of the source packets. This bit is not expected to be dynamically changing, changes occur only when the input stream or DTF configuration is changed. This also implies the nominal combiner cadence, either 46:47 or 46:51. The meaning of the source_packet_size field is defined by the following table

| source_packet_size | source packet size (bytes) |
|---|---|
| 0 | 188 |
| 1 | 204 |

Note that the definition of this bit places it in the MSB of the AF byte that contains it.

5. Priority Bit Error Recovery Data

Figure 7:
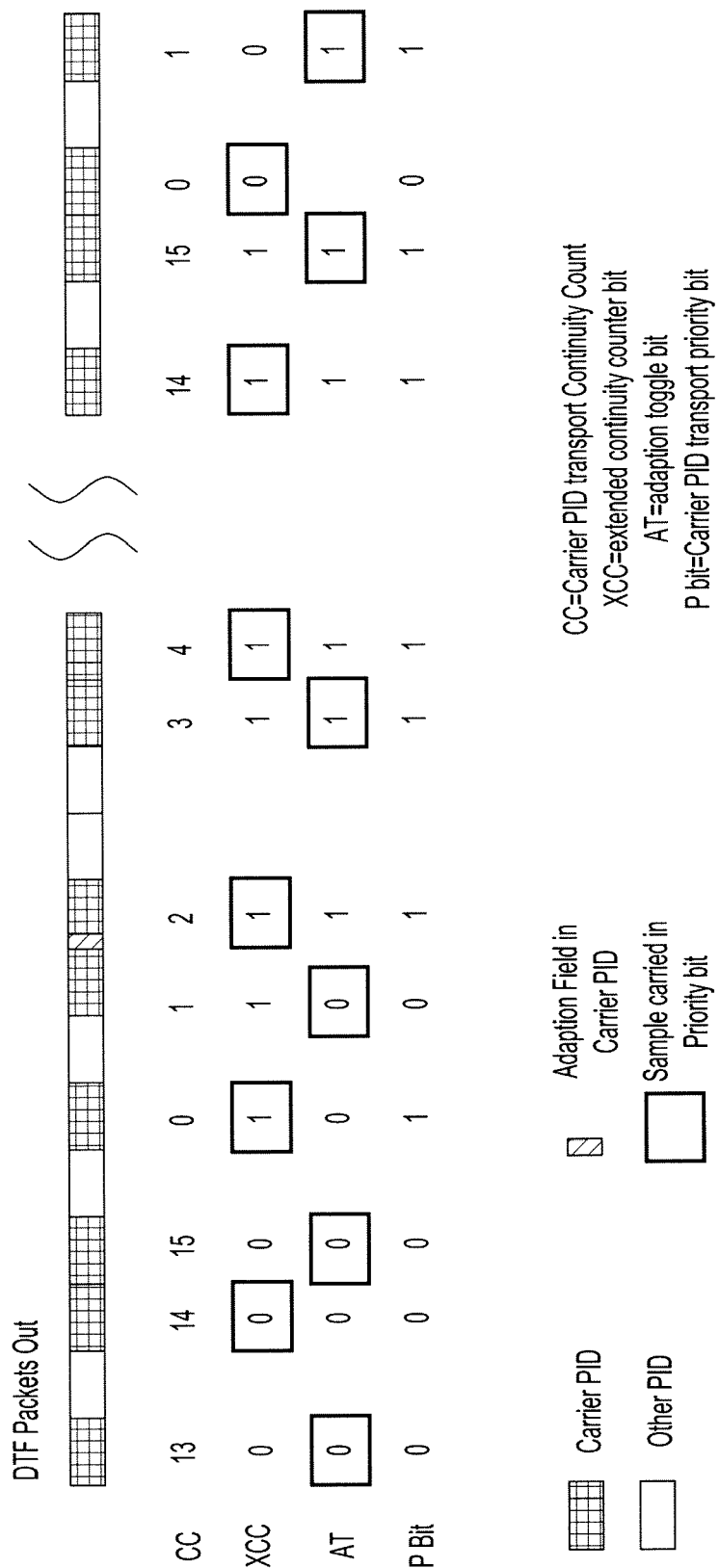
FIG. 7 depicts an example DTF output stream in accordance with an embodiment of the present invention.

The priority bit in the combined PID will be used to send two bits of extra data. The first piece is a continuity counter extension, the second piece is an adaptation field toggle. These two bits are time-division multiplexed into the priority bit based on whether the combined PID continuity count is even or odd. An example DTF output stream showing the state of these bits is illustrated in FIG. 7.

5.1 CC Extension Bit

Whenever the combined PID continuity counter is even, the priority bit will signal an extra upper bit of continuity count, which toggles when the main continuity counter wraps from 15 to 0. This provides an effective 32 packet continuity counter cycle that can be detected by the MTR 130 after observing at most two consecutive packets.

This extended counter allows the MTR 130 to determine how many packets were lost during an interruption. It can infer the rough scale of the packet loss from a measurement of the time, but due to the packet jitter due to the multiplexing of many combined PID's in the DTF 120, it does not know precisely how many. The extended counter lets the MTR 130 refine its rough estimate to a packet-accurate count with less chance of error. For significantly long duration losses, where the uncertainty is greater, the source_stream_continuity_count carried in the adaptation field is used to resynchronize. It is expected that for long duration packet losses, the additional time (expected 20 ms, worst case 40 ms) to see the adaptation field will not be significant.

5.2 Adaptation Toggle Bit

Whenever the combined PID continuity counter is odd, the priority bit will signal an adaptation_toggle bit. The adaptation_toggle bit changes state every time an adaptation field is sent, logically changing on the same packet as the adaptation field, and being sampled and sent either that same packet (if the CC is odd) or the next (if the CC is even).

The main purpose of this bit is to allow the MTR 130 to detect whether it missed an adaptation field in a short packet loss event. Assuming that the MTR 130 can successfully determine the exact number of carrier packets lost, and no adaptation fields were in the lost data, it would be able to compute the exact number of stream bytes lost, and the expected position of the source stream sync byte by simply relying on the continuous 184 to 188 (or 184 to 204 byte sequence, if carrying 204 byte source packets) byte payload pattern. However, if an adaptation field is present in the lost data, it would have to adjust the estimate by 20 bytes (the size of the adaptation field). If the MTR 130 believes that only a few packets have been lost, and that the equivalent interval corresponds to less than 40 ms, it can use a change of state in the adaptation_toggle bit to guess that exactly one adaptation field, and hence 20 fewer source bytes, was lost. If the bit did not toggle, it can guess that no adaptation fields were lost.

The key assumption here is that for higher data rates and shorter packet loss burst, the probability of losing more than one adaptation field is very small. For very low data rates, the adaptation_toggle will be less useful because this assumption no longer holds. However, at these low rates, the adaptation field will be providing enough information to fully resynchronize within a few packets, so the overall time to resynchronize is still only a few packets.

6. Numerical Example

Consider a source stream of 188 byte packets at 10.500000 MBit/s, being played through a DTF 120 with a local SCR clock rate of 27 MHz+1 ppm (27,000,027 Hz). Assume that the adaptation insertion interval is 40 ms and the DTF channel output rate is 40.000000 MBit/s.

Over 40 ms, there will be 52500 source bytes, or roughly 279.3 source packets, received at the DTF input. This will use up 285 combined PID packets of 184 bytes, with 60 bytes spilling into the adjacent carrier packet(s). Since STS timestamps are sampled at source packet start times, we expect that two hypothetical consecutive adaptation fields might have STS's measured from sync bytes which are either 279 or 280 source packets apart. STS's taken from packets that are 279 source packets apart will have STS's that differ in time by (279*1504/10500000) seconds, and measured against the local SCR will have a difference of (279*1504/10500000) *27000027 or approximately 1079013.65 apart. Thus, of those STS pairs which represent 279 source packet intervals, about two thirds will have an STS difference of 1079014 while about one third will have a difference of 1079013. The difference between STS pairs will reflect only the time between the associated source sync bytes, and are independent of actual post-combining multiplexing jitter of the channel PID packets.

The DTF output packets will be spaced at 1504/40,000,000 or 37.6 microseconds apart. The same adaptation field pairs would then nominally span 1063.8 channel packets. If there were no multiplexing jitter, we would expect PCR values to increment reflecting either a 1063 or 1064 packet interval measured at 27.000027 MHz, resulting in PCR increments in the set {1,079,158; 1,079,159; 1,080,173; 1,080,174}. Packet jitter due to round-robin multiplexing and stuffing packet insertion will necessarily change these values—this is essentially similar to the usual PCR mechanism.

D. Phase Compensated Renormalizable Dynamic PLL

Phase locked loop (PLLs) are well-known in the art as standard circuits in engineering to recover a frequency or phase (time reference) from an input signal. PLLs are conventionally implemented either (1) in analog components or (2) digitally in either an all-software or digital hardware platform such as an FPGA.

Most PLL circuits respond to an input signal with a fixed bandwidth. If the bandwidth is too low, the circuit takes a long time to lock up. If too high, the PLL lets too much noise from the input pass through to the output. Thus, many circuits operate with a single fixed bandwidth which is a compromise between lock time and noise rejection.

One modification to allow fast locking with low noise tracking is to adjust the PLL bandwidth from high to low upon initial acquisition. PLLs with adjustable bandwidths are also known in the art, and are also related to the well-known Kalman filter. However, they are typically implemented in analog form because it is easier to implement a continuous change of parameters. A smooth, continuous change of parameters is preferable to a discrete, non-continuous jump in parameters, as there will be less chance of a disturbance appearing on the output. The overall bandwidth is a function of both the loop gain and the bandwidth of the loop filter portion of the PLL, as most textbooks will describe.

Implementing a discrete jump in parameters is an obvious capability of a digital control circuit since changing loop gains by powers of two are easily attained with simple bit shifters. However, in a type I PLL, there is a linear relation between frequency offset between input and free-running frequency, and the static phase offset. A sudden change in the loop gain in a type I PLL can cause sudden jumps in the static phase offset, possibly causing instability and output disturbances. Even a continuous change will cause a shift in static phase offset which will be seen at the PLL output. This is the fundamental problem which this invention addresses.

Embodiments of the present invention describe a way to implement a variable bandwidth PLL in a digital form. At least two new features are provided: (1) renormalizable circuitry which allows the gain to be changed without causing a disturbance or instability in the loop, and (2) a phase compensation circuit, which allows the final output phase to be adjusted with each parameter change such that the output appears to be a smooth linear phase despite parameter changes.

These two features may be implemented using hardware, software and combinations thereof, including the use of, e.g., adders, registers, and shifters in a digital FPGA.

As will be explained in more detail below the PLL aspect of the present invention is not limited to the specific PLL design, in which gains are power of two and loop filter bandwidths are also expressed using first order IIR filters with powers of two feedback. Additionally, while it will be seen that this invention can be used to implement an MPEG-2 PCR clock recovery loop, the scope of the invention is not limited to MPEG-2 applications.

The filter gain in the circuit is implemented as a multiplier that can only multiply by powers of two. This can be easily achieved using a bit shifter, which is inexpensive to implement in hardware. The loop filter is implemented using a so-called "alpha filter" which is a convenient name for a first order IIR filter which implements the recurrence relation $y[n+1]=\text{alpha}*x[n]+(1-\text{alpha})*y[n]$ to turn an input sequence x[ ] into an output y[ ].

1. PLL Design Details

The present PLL design exploits the advantages of digital technology and control with the basic digital PLL (DPLL) and provides a loop that locks fast but tightens up. It has no velocity-compensation residual phase error, just like a type II PLL, but without actually implementing more poles in the open-loop gain. The core of the PLL can be renormalized at any time to allow a seamless, non-invasive change of loop parameters. The renormalization allows dynamic changes to the loop parameters. This dynamic behavior of the PLL during acquisition and locking implements (to a first approximation) a smooth mapping between a fast but loose high-bandwidth loop and a very low bandwidth, strongly noise-rejecting "brick."

1.1 Renormalization

In the classical PLL, especially a type I PLL, one cannot simply change the loop gain parameter mid-operation to change the bandwidth. This is due in part to the fact that a type I PLL has a steady-state phase error proportional to dF/LG where dF is the difference between the PLL's centre frequency and the incoming frequency, and LG is the gain of the loop (=phase comparator gain*VCO gain*user gain G). If G is changed, the steady state phase error will change which introduces a step function into the PLL. If the purpose of changing G is to reduce the loop bandwidth for improving noise rejection after acquisition, a glitch occurs every time improvement is attempted.

The basic idea behind renormalization is that when gains or IIR alphas are switched, it is desirable to know that the data going through the filter and the gain block is zero. That way, for example, zero times the old gain value is the same as zero times the new gain value. To make this happen, one can keep track of two offsets: one at the input of the loop filter/gain block, and one at the output. At a renormalization, the steady-state part of the loop phase error is placed into the accumulators, and only the AC part (zero) is kept in the loop filter.

Figure 8:
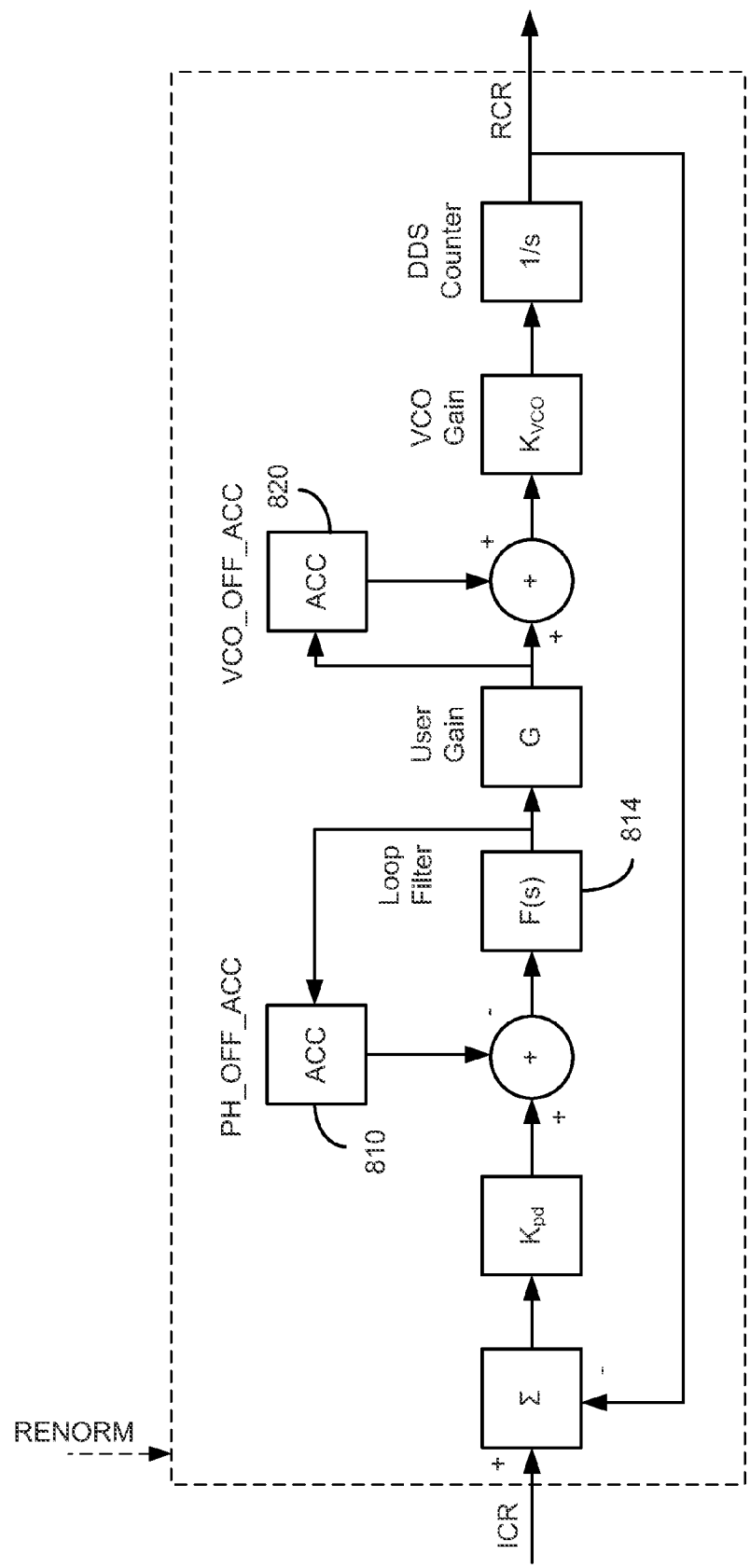
FIG. 8 shows a PCR recovery PLL loop that is renormalizable in accordance with an embodiment of the present invention.

FIG. 8 presents a clock recovery PLL loop that is renormalizable in accordance with an embodiment of the present invention. Implicit in this diagram is that the VCO is already offset, or centered at the nominal input clock reference frequency, and the steady-state phase error seen at the phase detector will be zero if the input clock reference timebase frequency is equal to the local clock. From time to time, at fairly regular but not exact intervals, a new input clock reference (ICR) sample value is presented to the PLL. Both the ICR's value and its arrival time are used to update the PLL. In an MPEG-2 PCR recovery loop, which is one representative application of this invention, the MPEG-2 transport stream program clock reference (PCR) snapshot plays the part of the input clock reference (ICR), while the recovered clock reference (RCR) is usually called the system clock reference (SCR) in MPEG-2 terminology.

At initial lock time, the two accumulators 810, 820 are loaded with zero, the loop filter 814 is reset, and the local RCR value is loaded with the incoming ICR. Kpd is the phase detector gain.

At the input side, the phase detector has an offset accumulator PH_OFF_ACC 810 which gets subtracted from the "raw" ICR delta, and at the output side, the VCO control output has an offset accumulator VCO_OFF_ACC 820 which gets added to the loop filtered VCO control output. At any point, without any disruption, a "renorm" can be triggered in which (1) integer bits of the IIR are added into the phase offset accumulator, (2) the current VCO output voltage provided by the user gain G is added into the VCO offset accumulator 82, and (3) the IIR is reset to zero. This is a substantially non-disruptive transformation, assuming that the loop filter gain F(s) is normalized to unity at s=0. Alpha (filter bandwidth control parameter, used in the equation above) and gain are changed on the clock cycle after (or at the same time as) doing a reform so that the IIR is zero.

If a renorm is never issued, the PLL operates just as expected for the basic type I PLL to act today, and the entire DC component of the phase offset is passed through the loop filter. Renormalization moves the DC into the accumulators, leaving only the zero-mean AC through the filter, enabling changes to alpha and G. This is discussed more fully in the "Dynamic Response" section below. If the loop bandwidth is small, and renormalizing is triggered periodically, the phase detector offset will converge to a more and more accurate estimate of what the initial phase mismatch was at the instant the PLL was stated, while the loop filter will be filtering only the AC component of the phase error.

1.2 Phase Compensation

As mentioned before, the type I PLL has a steady-state phase error proportional to frequency offset. Renormalization alone does not fix this. It is desirable to compensate for this, so that it is possible to track low-frequency wander without incurring extra phase error. In the type I PLL, the local recovered clock (RCR) will always be offset from the incoming ICR by this phase error. It is possible, however, to use the delta ICR as a measure of the phase error, or better yet, use the filtered delta as a cleaner measure of the phase error. Adding this to the RCR will bring the sum closer to the ICR, effectively removing the phase error.

Figure 9:
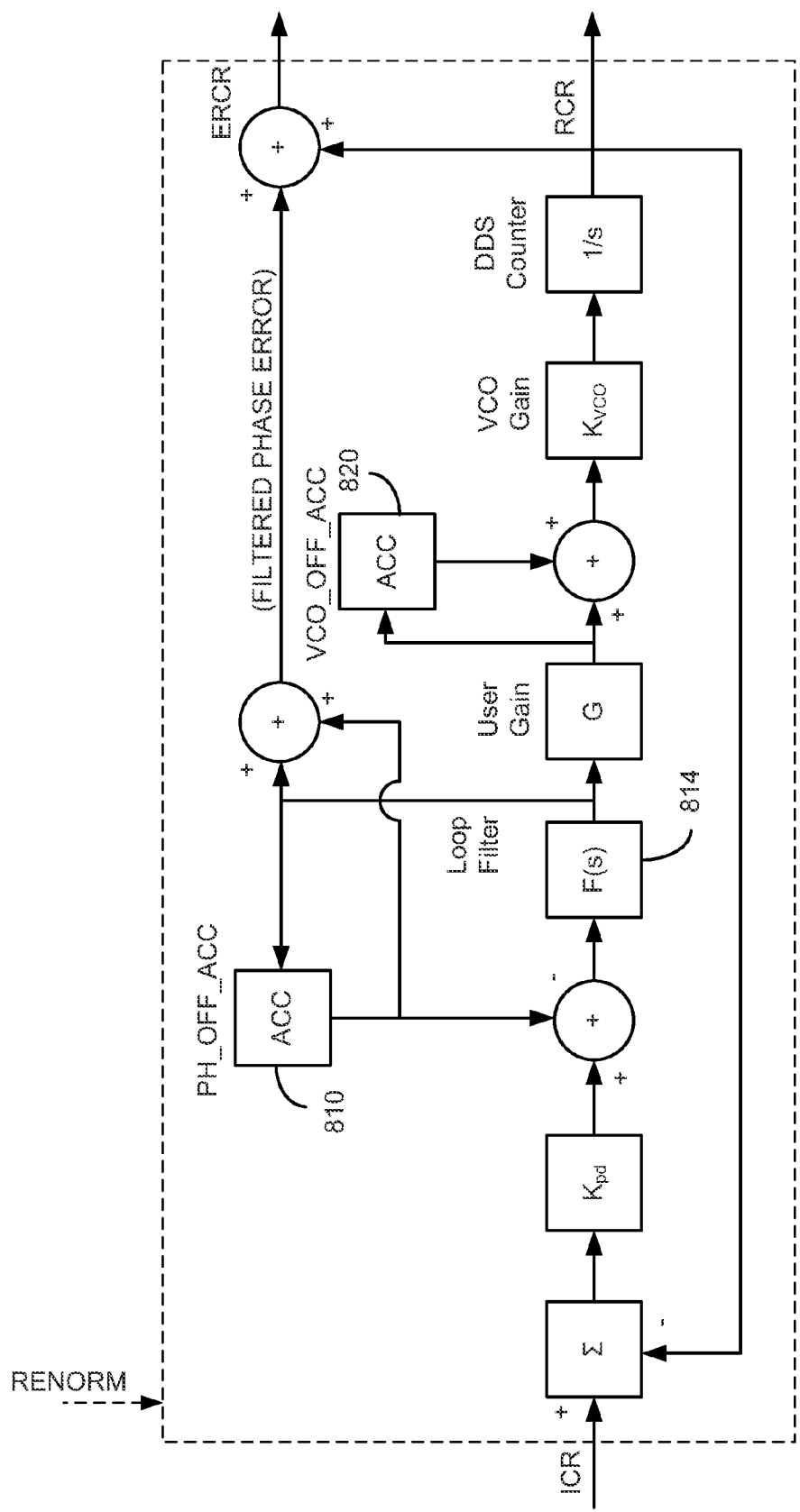
FIG. 9 shows a renormalizable PLL with phase compensated Effective SCR in accordance with an embodiment of the present invention.

However, this must work seamlessly over a renormalization. The approach is to add (1) the local RCR, (2) the phase detector offset accumulator, and (3) the integer bits of the IIR to come up with an "effective local RCR" (ERCR) which is the phase-error compensated RCR which feeds forward to the final output clock of the PLL. FIG. 9 shows the renormalizable PLL with phase compensated ERCR (Effective RCR).

This effective RCR has no phase error with respect to the real ICR, just like in a type II loop, and because locking is fast then tightening up smoothly, the value converges quickly and stays clean. In an MPEG-2 PCR recovery application, this can be typically near steady-state within 500 ms. At the end of the lockup, when the loop filter has most HF attenuation, the effective RCR is still relatively clean—clean enough for use. The effective RCR is also clean over a renorm, because the sum of (IIR_integer_part+phase_det_offset_acc) is constant before and after.

When a renorm with phase compensation is performed, it is basically a linear and feed-forward operation. As such there is no concern about adding extra poles or zeroes or stability like in a type II loop. The phase error is moved from the AC path (the loop filter) to the DC path (through the accumulators).

Figure 10:
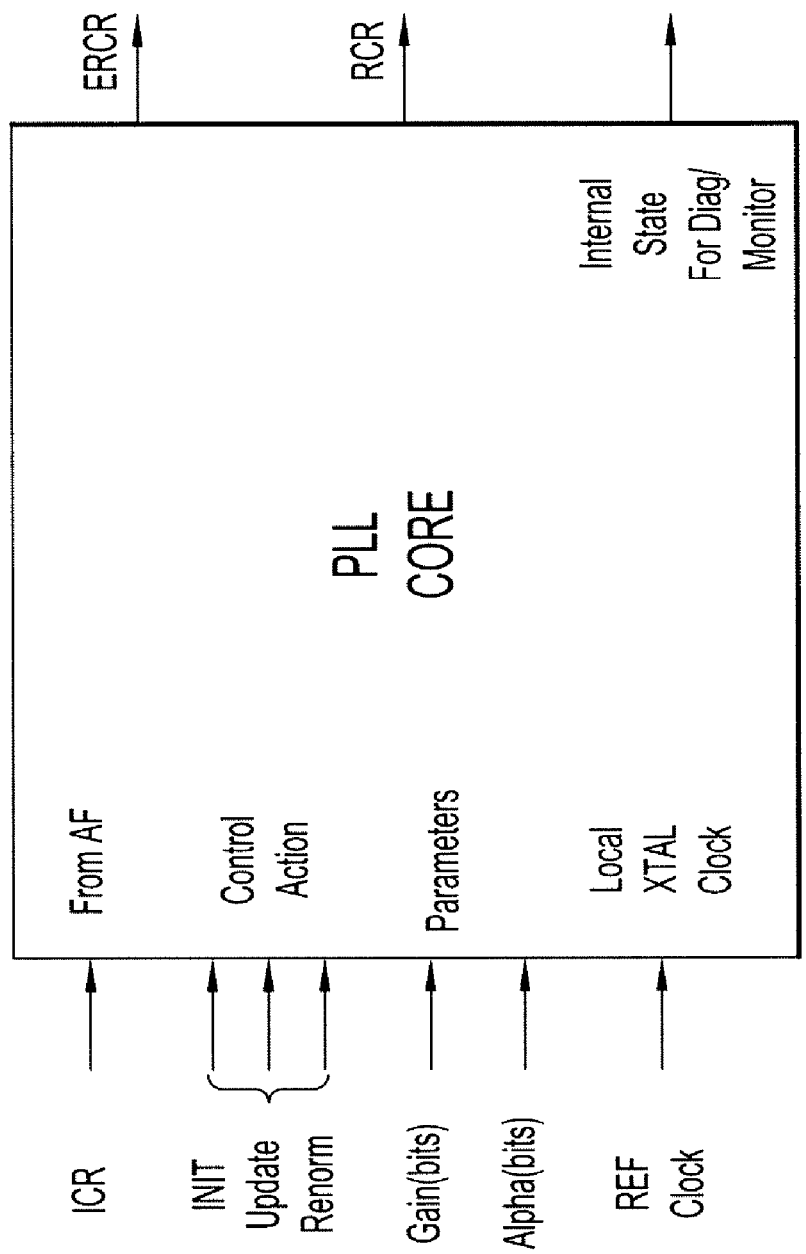
FIG. 10 is a functional block diagram and interface to a PLL that may be employed in connection with the PLL of FIG. 9 in accordance with an embodiment of the present invention.

FIG. 10 is a functional block diagram and interface to the PLL core of FIG. 9, which may be used by a dynamic control block and microprocessor interfaces. The PLL changes state only on receipt of a new ICR, according to the control input. It will either INIT (reload everything, e.g. on a channel change or loss of signal), UPDATE (update loop filter as usual while running), or RENORM (perform loop update as usual, and then perform a renormalization). The parameters (gain and alpha) are sampled by the PLL core and used for UPDATE and RENORM cycles. The parameters should only be changed following a RENORM cycle, prior to receipt of the next ICR.

1.3 Dynamic Response

The seamless change ability provides a much more desirable PLL lock characteristic. Start the PLL with a high gain and low alpha (i.e. a simple first order response), then halve the gain and double the alpha with a periodic renorm. In an MPEG-2 PCR recovery application this could be every 500 ms, for example. Initially, the PLL will lock quickly but at the expense of phase error. Progressively reducing this error, the PLL plateaus at target alpha and gain values. The phase detector offset converges to a more accurate estimate of the phase mismatch at the instant the PLL was initialized by the first ICR.

Figure 11:
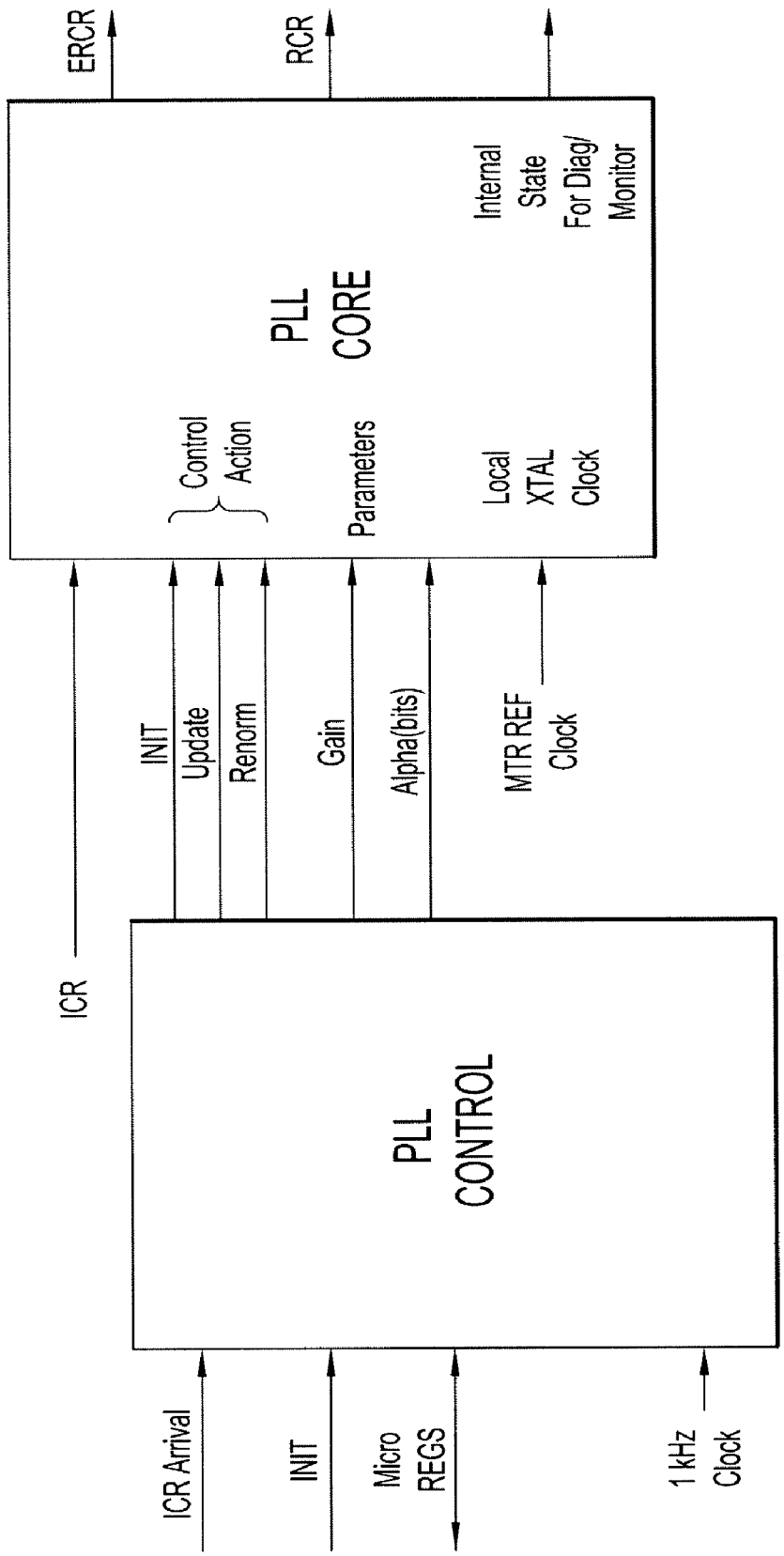
FIG. 11 shows a PLL controller that may be used in conjunction with the PLL of FIG. 10 in accordance with an embodiment of the present invention.

The PLL design in accordance with an embodiment of the present invention basically breaks into two parts: one is the core PLL (as just described with respect to FIG. 10) and one is the controller. The controller, as shown in FIG. 11, drives the core PLL inputs based on micro registers, the ICR arrival time, and a regular renorm trigger tick. The controller is a simple state machine which controls the fast-to-slow filter parameter transitions. The PLL controller is responsible for driving the dynamic filter parameters to the PLL core.

1.3.1 Loop Characteristics Sweep

The controller is basically a state machine that, after initialization, starts with an initial gain and alpha which are essentially a first-order loop (a simple exponential decay response defined by a time constant), with time constant on the order of one fifth of the renorm tick period. After time equivalent to five time constants has elapsed, with a clean, fast ICR, the phase error will have effectively converged to its steady state value. So after the renorm period alpha and gain are changed to increase the time constant and attenuate the jitter. After another renorm period, these values are changed again, and so on. At the renorm interval points, each time parameters are changed, a RENORM is issued to the core. In the interim, simple UPDATE commands are issued. To accommodate various design targets, the renormalization interval can be adjusted; a renorm interval of 500 ms and an initial time constant of 100 ms is a representative example for an MPEG-2 PCR recovery loop.

For the loop, the gain and alpha are specified in units of bits (gain=$2^N$ and alpha=$\frac{1}{2}^N$). The controller simply starts with an initial G and ALPHA, and increments/decrements either or both by a small value at each 500 ms update period up to a limit. Software registers provide G0 and ALPHA0 (initial values), GDEC and AINC (increments) and define the sweep interval (the renorm tick period, in ms). Software registers also set the maximum G and ALPHA. Software registers can also force the controller not to sweep (i.e. use a fixed G and ALPHA). Software registers can also force a manual "renorm on next ICR" for test purposes. To terminate the sweep at a fixed value, the micro provides a GMIN and an AMAX which clip the output of the "generators".

1.3.2 Interval Adaptive Parameters

The controller measures the interval between successive adaptation fields using a very simple logarithmic interval counter to adjust the PLL loop alpha to match the sampling rate.

The controller also uses a fixed clock (for example, 1 kHz) to schedule bandwidth changes at a schedule that does not depend on sampling rate. Thus, there is no significant lock time penalty for ICR sampling rates slower than nominal, nor is there an artificially high loop filter bandwidth if faster ICR rates are used.

1.3.3 Log Interval

A coarse "ratio approximation" is made to achieve a constant alpha filter bandwidth in Hertz. It can be assumed that when the sample rate doubles, the alpha shift can be doubled (i.e. use a smaller amount of feedback) to compensate. Thus, by knowing the base-2 log of the ICR interval in ms, it is possible to subtract this from the "desired" alpha at some reference interval to get the actual alpha in bits for the PLL core. This is a nice example of a potentially complex operation (normalizing alpha using a division by time) being transformed into a simple subtraction in the logarithmic domain: the alpha is already expressed logarithmically (i.e. in bits) and the interval can be measured logarithmically in a relatively simply manner.

The log interval can be measured by one of two simple methods, although any other method can be employed without deviating from the spirit of this invention run a counter that measures milliseconds since the last received ICR directly, then use an upper-bit finder (a priority encoder) to determine the position of the uppermost '1' bit run a direct form logarithmic counter When employed in an MPEG-2 PCR tracking loop, the interval preferably captures at least 1 second, so the log of the millisecond interval will be in the range 0 or 1 (1 ms apart) to 10 (1 second, or 1024 ms apart). It is not crucial that the transitions are exact, since there is a large error due to truncation of integers in any case. We expect that a 40 ms interval should give a log value of 5 (>32 but <64).

Figure 12:
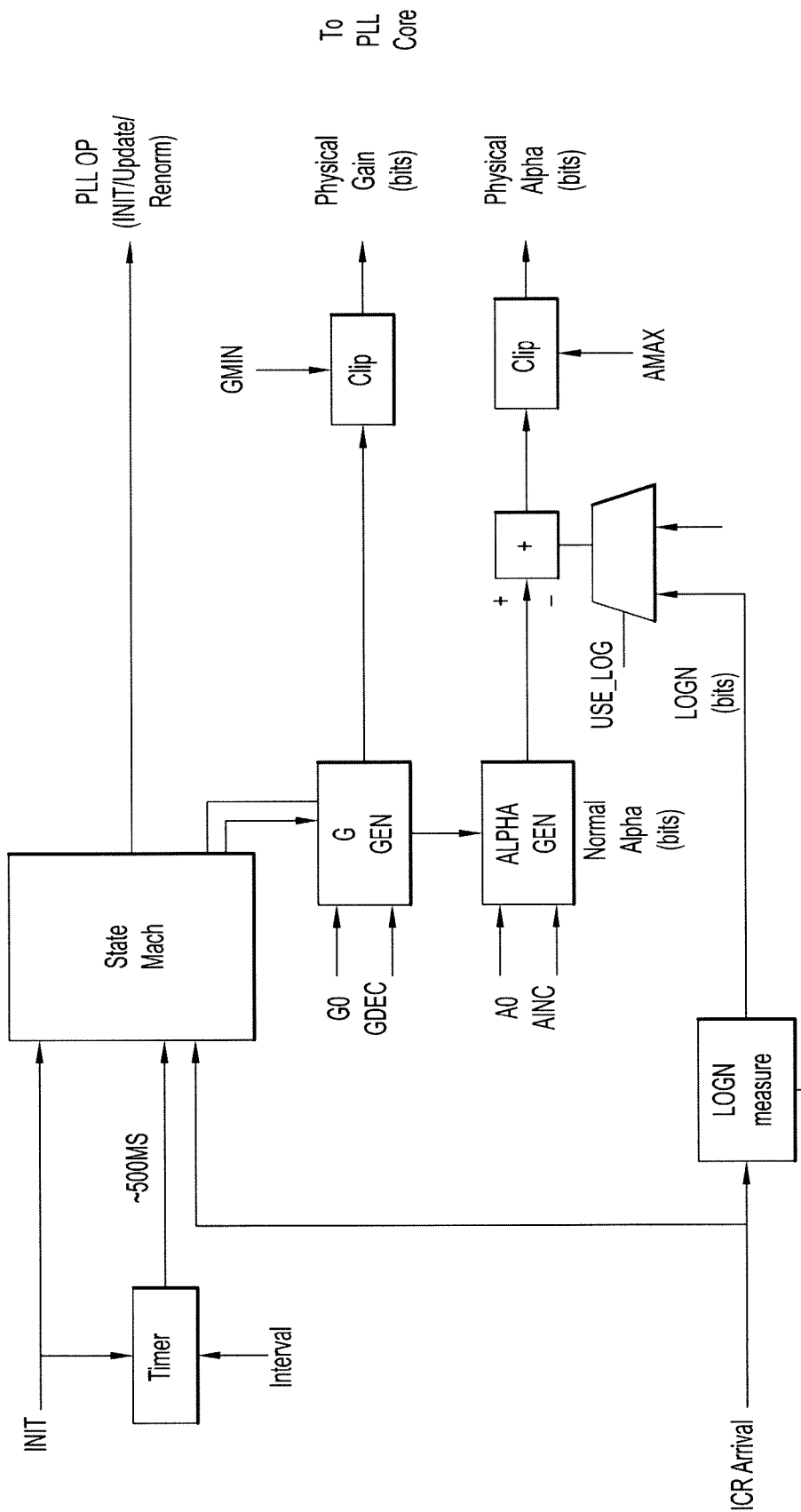
FIG. 12 shows a circuit for implementing the interval compensated alpha for a PLL in accordance with an embodiment of the present invention.

The circuit to implement the interval compensated alpha is as shown in FIG. 12. The state machine and the CPU values set the alpha ignoring ICR arrival interval. The alpha gets adjusted at the controller output by the measured log interval LOGN. The gain is not adjusted.

The state machine just starts at INIT and counts up, e.g., 15 states, tickling the G_GEN and ALPHA_GEN blocks to generate new values of G and ALPHA (in bits) every 500 ms, along with the appropriately timed RENORM to the PLL core. The generators are just simple accumulators: starting with the initial value G0, subtract to it GDEC (the decrement) every 500 ms.

The logn compensation can be disabled by a bit USE_LOG.

AMAX and GMIN determine the maximum values of G and alpha. These can be used to terminate the run of G or alpha prematurely, allowing a hold, for example, for G fixed after 1500 ms (hitting the limit) while alpha might continue to increment.

Alpha gets clipped at zero so as not to create "negative alpha" or unstable IIR's. A control ALPHA (in bits) of zero represents alpha=1, or a simple all-pass filter with no delay.

E. MTR Packet Error Handling

The following are considerations for handling bad packets received from the DVB-S/S2/ASI input interfaces at the MTR 130, and how packet error handling may affect the transmission of DVB-T packets.

As noted, Single Frequency Networks (SFNs) require DVB-T transports to be delivered simultaneously to geographically adjacent modulators/transmission sites with a high degree of synchronization. The modulation scheme also requires that no data be dropped within the transport otherwise the DVB-T transmissions may interfere destructively with one another. Either problem, synchronization or data loss/corruption, may degrade local DVB-T signals. To avoid broadcast quality issues, highly reliable transmission mechanisms such as fibre links are preferred. However, delivery to remote locations favours satellite delivery (e.g. DVB-S/S2) which introduces additional data loss/corruption issues.

Barring transmission or reception issues, the MTR 130 will decombine DVB-T streams from the received DVB-S/S2 transport(s) in exactly the same form and comparable timing as they had arrived at the uplink DTF 120 and were combined into the conveying DVB-S/S2 transport(s). Unfortunately real-life conditions dictate that the incoming DVB-S/S2 data stream will sometimes be interrupted or damaged. The combined DVB-T streams will also be observed to be damaged at the output of the MTR 130 in the form of missing, corrupted, or fragmented packets.

Within the MTR 130, a single packet lost or corrupted packet will usually result in damage to two underlying DVB-T packets in light of the combining process described earlier herein. The megaframe synchronization used within DVB-T requires all packets within the megaframe to be present. If not complete, the entire megaframe could be thrown out by the DVB-T modulator. This would correspond to a signal loss of one second. A particularly unfortunate event would be the loss of a handful of packets around a megaframe boundary leading to a two second outage. In brief, very minor DVB-S/S2 signal damage could be amplified to a noticeable interruption within the DVB-T transmission. Similar disruptions at geographically adjacent sites could lead to seriously impaired local broadcasts.

DVB-T modulator vendors may have varying interface considerations and tolerances but there is little that can be done for an incomplete input stream.

The MTR 130 preferably generates alarms for combined packet corruption and/or signal loss. This also allows for a software controlled disable of the outputs so that the DVB-T modulator may respond in a predictable fashion during severe transmission or equipment failures. Although error correction can be improved by reducing transmission capacity in favour of FEC rate, an MTR 130 cannot correct corrupted packets. At best, an additional mechanism may be introduced to maintain the timing of the megaframe. The following discussion examines possible solutions.

DVB-T Input to DTF Characteristics

The DVB-T streams sent into the DTF 120 are considered to be "perfect" with no errors. All sites receive the same content—the transmission link preferably does not modify input supplied to the link. At the uplink, all of the constituent DVB-T transports are combined into a single DVB-S/S2 transport for transmission to MTRs 130. It is assumed that the DTF 120 follows the combining rules perfectly to assemble packets and then supplies a compliant ASI stream to the DVB-S/S2 modulator.

For the purpose of some error processing actions (e.g. null packet insertion on error), the assumption that DVB-T streams are constant bit-rate within the time intervals must be made (i.e. original stream cannot use ASI spacing in place of packets).

Effects of DVB-S/S2 Stream Errors

DVB-S/S2 stream errors will result in corrupted or missing packets within the DVB-S/S2 stream. Missing DVB-T packets are a concern because the loss of one packet could cause the DVB-T modulator to lose synchronization with the other modulators in the DVB-T single frequency network and thereby cause destructive signal interference. In practice, the DVB-T modulators protect their systems by discarding incomplete megaframes. This translates to a local tower outage.

Figure 13:
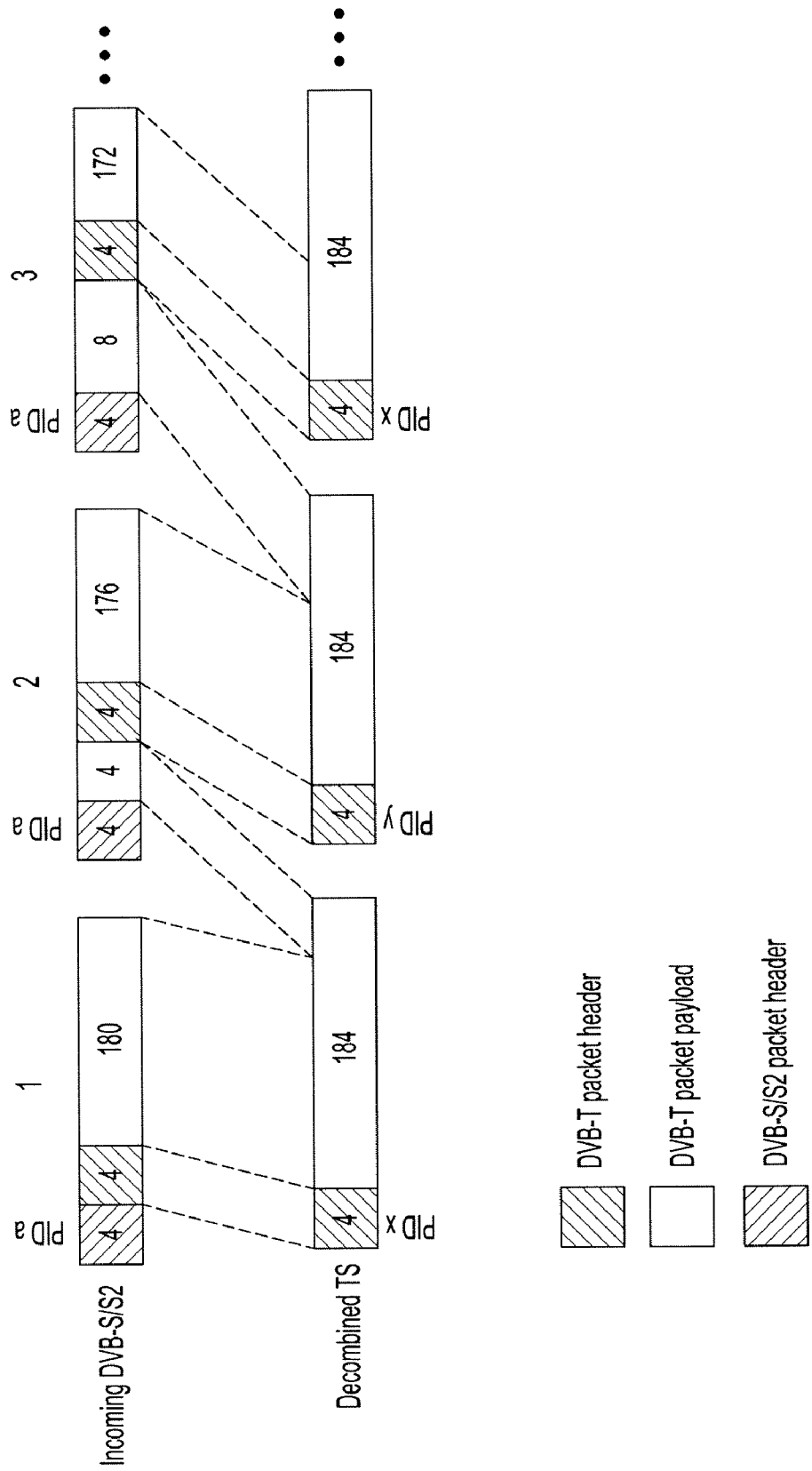
FIG. 13 illustrates the relation between the source packets and those of the transmitted DVB-S/S2 packets in accordance with an embodiment of the present invention.

As seen in FIG. 13, the combining process risks as many as two DVB-T packets for any single damaged DVB-S/S2 packet. For example, loss or corruption of DVB-S/S2 packet "2", will damage the packet for DVB-T PID-x as well as the packet for DVB-T packet PID-y. Likewise, damage to DVB-S/S2 packet "3" will corrupt DVB-T packets PID-y and PID-z. As noted before, a single packet error in the DVB-S/S2 stream can impair the DVB-T stream for as long as a full mega-frame.

Depending on the nature of the damage to the DVB-S/S2 packet, different effects will be noticed in the DVB-T stream.

Damage to the DVB-S/S2 packet header will cause the least manageable effects but damage to the payloads may corrupt the DVB-T packets anywhere.

The minimum number of DVB-T packets that may be lost when a DVB-S/S2 packet is lost is limited to one. This applies to the case in which the original DVB-T payload is carried in a DVB-S/S2 packet different than the one which carries the DVB-T header.

DVB-S/S2 Transport Error Indicator

The DTF 120 sends packets with transport error indicator (TEI) bit cleared. The presence of a set TEI means that some device between the DTF 120 and the MTR 130, most likely the MTR's RF demodulator (see FIG. 4), detected an error within the received packet. The location or nature of the error is not identified.

Possible effects of bit errors within the DVB-S/S2 packet header include:

Incorrect packet ID (PID)

Packet scrambling control state error

Adaptation field count error

Continuity count error

Payload start bit error

Incorrect Packet ID (PID)

The DVB-S/S2 packet ID identifies packets as belonging to one of the combined DVB-T streams, to the in-band control stream packets, or to other, unspecified streams. If a packet ID is damaged, the packet will be seen to belong to one of these other streams. The original DVB-T stream will have at least one missing packet, at least one and possibly two corrupted packets and it may experience a temporary loss of packet sync.

A worst case event will damage the packet ID so that the packet appears to belong to one of the other combined DVB-T streams within the overall DVB-S/S2 transport. If this happens, then both the original DVB-T stream and the packet's "new" DVB-T stream are corrupted. Both streams may suffer a temporary loss of packet sync.

Packet Scrambling Control State Error

If the descrambling state of a DVB-S/S2 packet is incorrect the effect will be equivalent to a single missing DVB-S/S2 packet. In this case, one or two DVB-T packets will be damaged and one will be lost.

Adaptation Field Count Error

This corrupts the single packet if the MTR 130 processes the adaptation field. There should be no such consideration in the MTR 130.

Continuity Count Error

This will cause a warning message. Presumably, packets have already been lost from the stream but not necessarily. Any action to be taken will depend on other associated deficiencies.

Payload Start Bit Error

Current implementations of the present invention ignore this issue.

Payload Content Errors

The effect of damage to the payload of a DVB-S/S2 packet depends on the purpose of the packet. If the packet belongs to one of the combined DVB-T streams, the damaged packet will be output to that stream and the DVB-T output will contain an interval of damaged content. The effect of the damaged content varies according to the purpose of the packet within the DVB-T stream and whether the header has been affected. Effects range from packet sync loss to no effect at all.

If the damaged packet belongs to in-band control then the in-band control processing may be impaired. The MTR's in-band control processing algorithms preferably minimize the impact of damaged packets by detecting and rejecting data that is inconsistent or out of range.

If the damaged packet belongs to an independent, non-combined stream that is directed to an ASI output then the stream will contain an interval of damaged content. The impact may not be predictable but has no bearing on the transmission and reconstruction of the original DVB-T stream.

Error Processing

Application Layer

Two mechanisms are available for error handling. At the application layer, long term difficulties result in the output either being suppressed completely or replaced by a spacing protocol. This also covers corner cases such as startup, transport changes, etc. The spacing protocol allows either null packets or ASI blank spacing. The response is specified by an installation option per ASI output.

Firmware/Hardware Layer

At the stream processing level, damaged packets are removed and replaced via the selected spacing mechanism.

In the current embodiment, nothing can be done directly for the combined DVB-T streams—the MTR 130 does not have the ability to directly process those packets. Instead of content restoration, error processing attempts only to recover packet spacing.

DTF Error Handling

Figure 14:
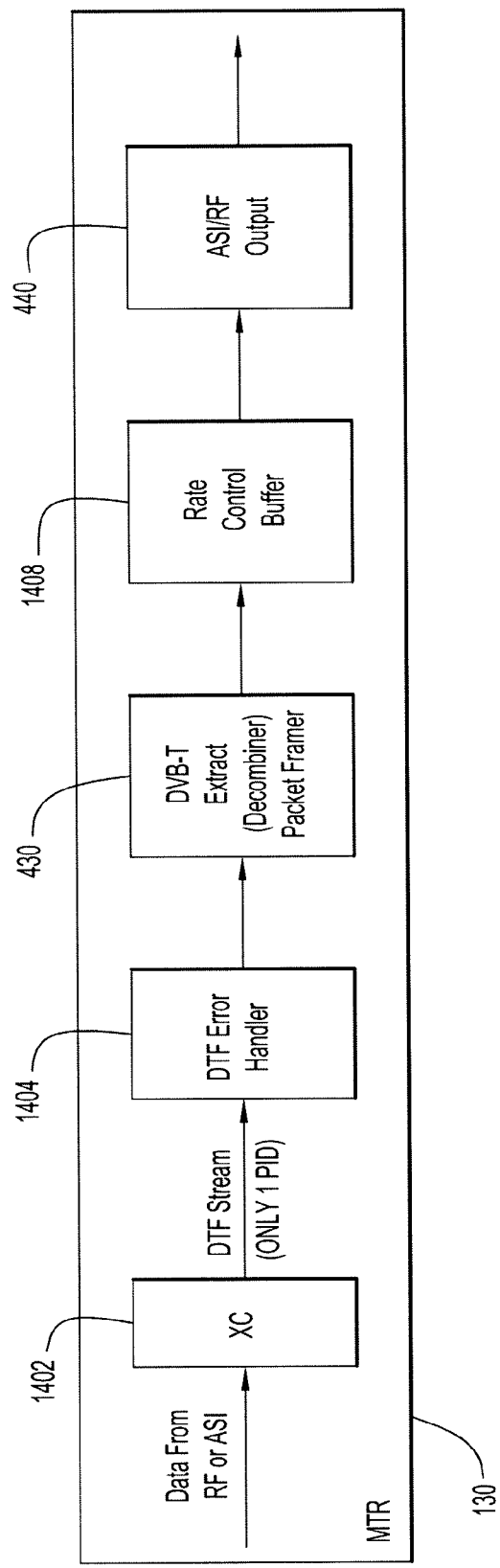
FIG. 14 shows a location for a DTF Combined Transport Packet Error Handling Block in the MTR in accordance with an embodiment of the present invention.

As shown in FIG. 14, the DTF Error Handling Block 1404 is located on the output of the cross connect (XC) 1402 in router 440 of an MTR 130 (router function) and sits astride a single PID DTF stream. The flow chart of FIGS. 15A-D represents the decision making process that is applied to each incoming packet. The most important job of module 1404 is to ensure that the expected number of packets per megaframe is maintained so as to minimize the damage to the downstream SFN. The process described herein is designed to determine if each incoming DTF packet should be dropped or allowed to continue, whether future packets should be dropped or whether additional DTF Stuff Codes must be added (This is performed using a special DTF Stuff Code that is translated by the DVB-T extraction block into the correct number (1 or 2) of DVB-T Stuff Codes which are later replaced in the Rate Control Buffer 1408 by null packets).

The DTF Error Handler 1404 preferably has the following INPUTS.

LER=Link Error: This is an error signal which is asserted when an RF or ASI input has gone for a specified period of time with NO PACKETS. This signal is also asserted when RF Loss of Lock is detected. The LER is cleared when the ASI/RF synchronizer finds a new full packet.

LOS=Loss of Synch: This is an error signal which is asserted when the ASI synchronizer is hunting for a packet lock on the incoming stream. The RF version of this signal is largely unused as the RF modulator provides a Start of Packet (SOP) indicator directly.

Incoming DTF Packets from the XC

Each incoming DTF packet may have any or all of the following problems.

TEI=true or false

CC=valid or corrupted

PID=valid or corrupted (a corrupted PID would indicate the packet was diverted from another stream by error and does not belong here). It is also possible for a packet that belongs in this stream to be missing due to any number of conditions.

The DTF Error Handler preferably has the following CONTROLS, indicated by reference numeral 1420 in FIG. 14:

QSTF=Maximum number of DTF Stuff Codes (0-7) that are allowed to be inserted in an attempt to correct a single CC discontinuity.

QDRP=Maximum number of incoming packets (0-7) that are allowed to be dropped in an attempt to correct a single CC discontinuity.

TEI Handling=SIMPLE: This mode will ALWAYS replace a TEI packet with DTF Stuff Code.

TEI Handling=COMPLEX: This mode gracefully corrects for a single packet from the wrong stream without losing REAL DATA, the cost for occasions when the packet is NOT from another stream is one extra DTF Stuff Code that will have to be inserted on the next valid packet arrival when the CC difference is detected.

AVG_DTF_PACKET_TIME=This value is realized as a DDS M value which determines the frequency at which the Avg Pkt Time Strobe is generated.

The DTF Error Handler has the following Flags/Resources that are used in connection with the processing depicted in FIGS. 15A-D, which are explained in more detail later herein.

The StuffTimer is a DDS which is programmed to produce Strobes at the average DTF packet time. When the stuff timer is OFF it is held in reset. Once the Stuff Timer is turned ON the Error Handler 1404 translates the incoming strobes into an offset distribution to avoid inserting Stuff codes too soon and thus forcing the dropping of REAL data. The offset pattern is as follows:

Stuff_Timer=ON—Pkt Strobe 1 (0 Stuff Code)—Pkt Strobe 2 (1 Stuff Code)—Pkt Strobe Time 3 (2 Stuff Codes)—Pkt Strobe Time 4 (1 Stuff Code)—Pkt Strobe Time N (1 Stuff Code). Total Stuff Codes inserted after the fourth Pkt Strobe Time=4, so the pattern is back on track. This distribution is only really effective with jitter less than about 2 Average Pkt Times.

The BAD_CC_FLG is used to allow single packet exceptions from the expected CC pattern without causing corrections until the next packet confirms that there is a problem. Once the BAD_CC_FLG is set then NO further exceptions are allowed, it indicates that the DTF stream has already had its one and only CC pattern exception and any further pattern differences are to be dealt with immediately.

The DRP_CNT is a counter that keeps track of any packets that the algorithm has decided need to be dropped to correct the megaframe packet count. Once a drop correction has been started and the expected CC count updated, the process continues to look at incoming packets as normal even though these packets will be dropped until the DRP_CNT reaches zero. It is possible for a second correction to happen before the previous drop correction has finished (this will simply add or subtract packets to/from the DRP_CNT).

The STF_CNT is a register that is cleared every time the process completes and indicates how many DTF Stuff Codes should be inserted BEFORE the current packet. There is NO HISTORY for STF_CNT.

Reference is now made to FIGS. 15A-D, which depicts a flowchart that represents a process for handling DTF errors. Each separately numbered branch in FIGS. 15A-D is discussed in turn. Note that branch values in brackets are the nominal path assuming DRP_CNT=0 when the process begins, if DRP_CNT>0 then other branches (10, 11, 12, 13) may be taken.

BRANCHES 1 and 14 represent the normal operating branch and it occurs as long as the EXP_CC matches the CC (BRANCH 10). This is also the logic that is followed whenever an incoming packet is detected regardless of other conditions. This branch is the highest priority of the branches leaving the WAIT STATE.

More specifically, from wait state 1502, a packet arrives and it is determined at step 1504 whether a TEI is received. If no, then it is determined at step 1506 whether the Stuff Timer is ON or BAD_CC is set. If not, then the process enters a region 1570 of the flow chart that handles packets when the system is in a normal state.

At step 1508 it is determined whether CC=EXP_CC. If yes, then EXP_CC is incremented as indicated by step 1510. The flow then moves to step 1512 where it is determined whether DRP_CNT=STF_CNT. If yes, then at step 1514 it is determined whether a TEI has been received. If yes, then at step 1515 the incoming packet is dropped, one stuff code is inserted and DRP_CNT is reset to zero. If at step 1514 no TEI was received, then at step 1516 the incoming packet is passed and the DRP-CNT is reset as shown. It is noted that step 1515 corresponds to Branch 11, which is a variation on the normal branch where the current packet must be dropped and it is replaced by a DTF stuff code. This branch is also reached if there are N pending drop packets (DRP_CNT=N) and a new ADD correction is needed (two overlapping CC corrections one add, one drop) of N DTF stuff codes (STF_CNT=N) and the two cancel each other out.

BRANCH 2 is reached when the stream is MISSING a packet from the stream and the next packet looks like EXP_CC+1, as indicated by step 1520. In this case a DTF stuff code is inserted (step 1522) in front of the current packet to replace the packet that is presumed missing.

BRANCH 3 (step 1524) is reached if a packet arrives with NO TEI and a CC that is not EXP_CC and not EXP_CC+1. This packet could be a misplaced packet from another stream OR a valid packet from the expected stream with a corrupted CC (there is no way to tell the difference at this point). On the chance that this is a single error the process DOES NOT correct this CC difference but instead sets the BAD_CC flag which will force an immediate correction if another CC difference is detected. In either case the DRP_CNT is incremented, thus forcing this current packet to be dropped.

Figure 15A:
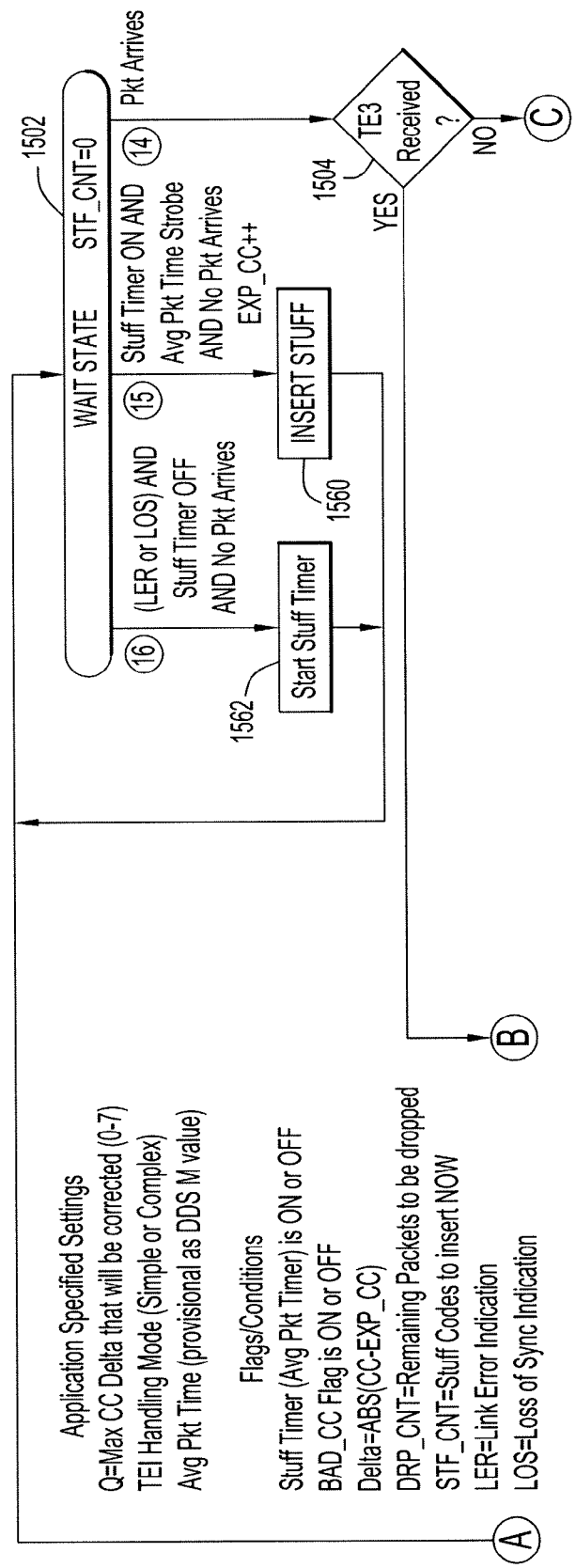
FIGS. 15A-D depicts a flowchart that represents a decision making process that is applied to each incoming packet in accordance with an embodiment of the present invention.
Figure 15B:
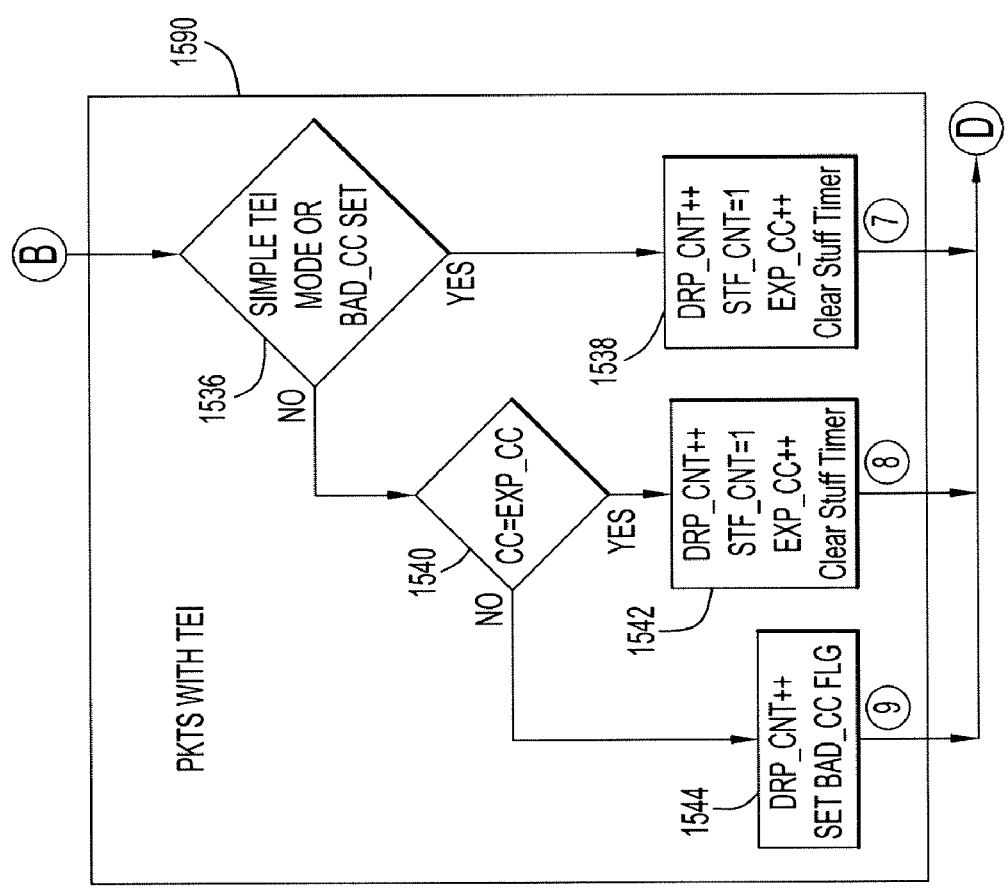
Figure 15C:
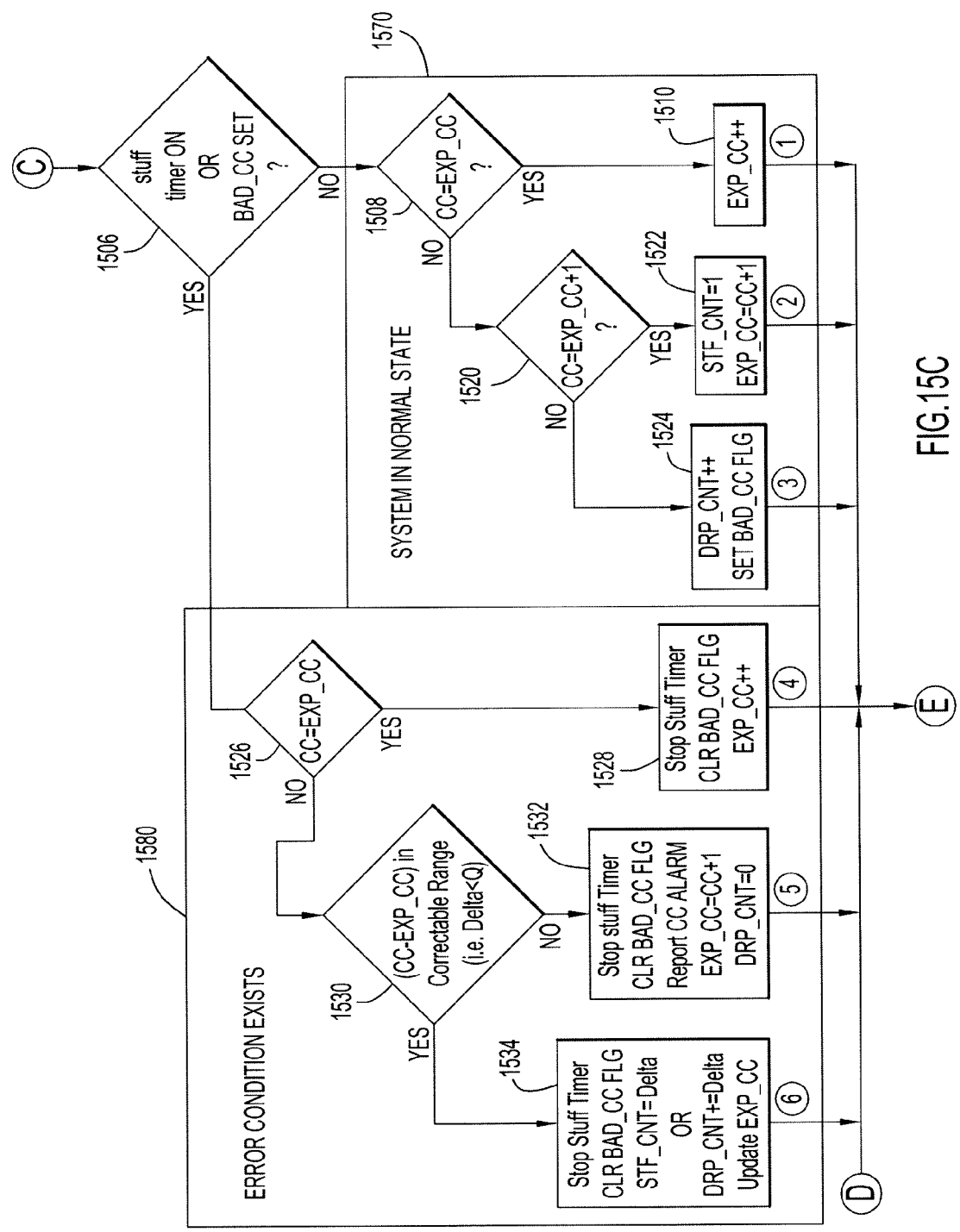
Figure 15D:
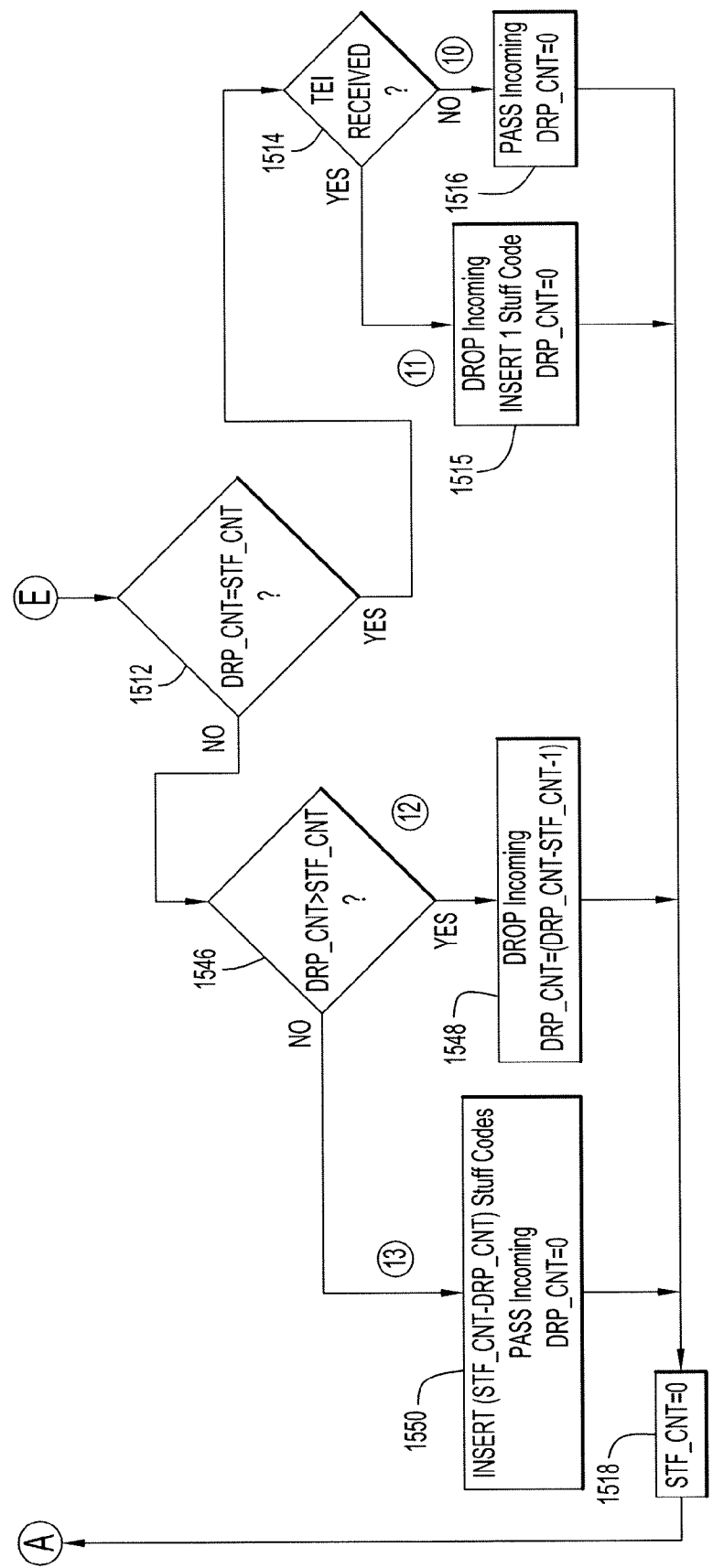

BRANCH 4 is the first branch in the region 1580 of FIG. 15C that handles the case where an error condition exists. Branch 4 (including steps 1526 and 1528) indicates that either the process has returned from a stuff packet insertion interval and is perfectly aligned with the incoming CC OR that the last valid packet was probably misplaced and the process was right to drop it. In either case the process is now correctly aligned and no action needs to be taken (e.g., BRANCH 10). The BAD_CC flag is always cleared in this branch.

BRANCH 5 (including steps 1530 and 1532) indicates that the process returned from an error condition or that the last packet's CC was corrupted and the result is a CC discontinuity that is too large to correct. In this case an alarm will be reported and all flags (including DRP_CNT) will be reset as the block will effectively begin processing using this packet as a clean start. The BAD_CC flag is always cleared in this branch.

BRANCH 6 (including step 1534) indicates that the process returned from an error condition or that the last packet's CC was corrupted and the result is a CC discontinuity that can be corrected. Depending on the difference between EXP_CC and CC the process will either immediately insert the required number of DTF stuff codes (via BRANCH 13) OR add the required number of packets to drop to the value currently stored in the DRP_CNT counter (via BRANCH 12). The BAD_CC is always cleared in this branch.

BRANCH 7 is the first branch in a region 1590 of FIG. 15B that handles packets with TEI, i.e., packets with known problems. This branch is reached when TEI_HANDLING=SIMPLE OR BAD_CC is set (step 1536) and a packet with TEI set arrives (step 1504). In this case the DRP_CNT is incremented by one to ensure the current packet is dropped and a DTF stuff code is immediately inserted to replace the damaged packet, as indicated by step 1538.

BRANCH 8 is only reachable when the CPU has set TEI_HANDLING=COMPLEX (step 1536) and a TEI packet arrives with CC=EXP_CC (step 1540). In this case the process increments the DRP_CNT to ensure the current packet is dropped and immediately replaces it with a DTF stuff code (step 1542).

BRANCH 9 (step 1544) is only reachable when TEI_HANDLING=COMPLEX and a TEI packet arrives with an unexpected CC (step 1540). In this case the process increments the DRP_CNT to ensure the current packet is dropped but does not insert a DTF stuff code (since this may indicate the packet came from another stream) but the process does set the BAD_CC flag to indicate that the process has already given this stream its one exception.

BRANCH 10 is the normal operation branch, as mentioned, where there are no pending packets to drop and the incoming packet is passed through OR the number of pending packets is exactly equal to the number of requested DTF stuff code (STF_CNT==DRP_CNT) assuming the current packet is NOT TEI and thus should not be dropped. In either case the incoming packet is passed through, no DTF stuff codes are inserted and the DRP_CNT is cleared (DRP_CNT=0).

BRANCH 12 is reached if there are more pending drops than requested stuff inserts (DRP_CNT>STF_CNT) (step 1546). In this case stuff requests cancel out the pending drops leaving a value greater than 0 which ensures the current packet is dropped. (DRP_CNT=DRP_CNT−STF_CNT−1) step 1548).

BRANCH 13 and step 1550 is reached if there are more requested stuffs than pending drops (STF_CNT>DRP_CNT). This state can only be reached from BRANCH 6 or BRANCH 2 so the current packet must NOT be dropped. The process therefore inserts (STF_CNT−

DRP_CNT) number of DTF stuff codes and clears the DRP_CNT since all remaining drops have been accounted for (DRP_CNT=0).

BRANCH 15 (step 1560) is taken when the stuff timer is running and the Avg Pkt Time Strobe occurs. This branch forces the insertion of a DTF stuff code using the distribution discussed below in the Stuff Timer description. This branch inserts stuffing packets at the same rate as the combined stream being processed. This will occur if the incoming stream contains gaps greater than one packet duration, as may occur because of Link Error or Loss of Sync triggered by Branch 16 (step 1562).

BRANCH 16 (step 1562) is taken when a Link Error OR Loss of Sync are detected AND the Stuff Timer is not already running. This step turns on the Stuff Timer so as to begin generating the Avg Pkt Time Strobe. This maintains the average rate of packet insertion for the DTF stream until such time as valid packets return. If valid packets do not return and the max corrected packet limit is reached, DTF Error Handling is disabled and the ASI TS data outputs (e.g. 440) are optionally muted.

Although the current embodiment limits error handling to management of packet timing and count, it is possible to include packet restoration capabilities. Whereas the current embodiment limits each route to consider its error events in isolation, information from all combined PIDs may be pooled in order to more correctly place or restore damaged packets within the TS. It is not foolproof but permits a degree of packet restoration.

In the simplest restoration example, all combined PIDs are filtered and tracked on each input port. Individual packets earmarked as mislabeled by PID may be verified against each of the other combined PIDs. If the correct identity is established then the packet(s) may be inserted where appropriate and stream corruption possibly avoided. In more difficult cases, more than one packet may be mislabeled and more than one stream may be missing packets. The number of candidate packets and available packets need not match. In such cases, a candidate packet is tested against its most probable space. The test may be as simple as confirming that all affected combined PID sequences satisfy basic criteria after insertion of the candidate packets. These criteria include but need not be limited to continuity counts and AF counts. A more extreme validation of the candidate stream would require that all combined PIDs be decombined to confirm that the packets within the original TS are uncorrupted. Such an approach would be prohibitively expensive in terms of CPU power and logic gate count. A lesser example would only require that the decombining process remained synchronized for each of the candidate stream corrections. In each of these cases, there is an assumption that a damaged packet must originate from somewhere within the current carrier TS. The error handling algorithm may facilitate packet restoration if errors in each of the combined PIDs are considered in aggregate.

Figure 16:
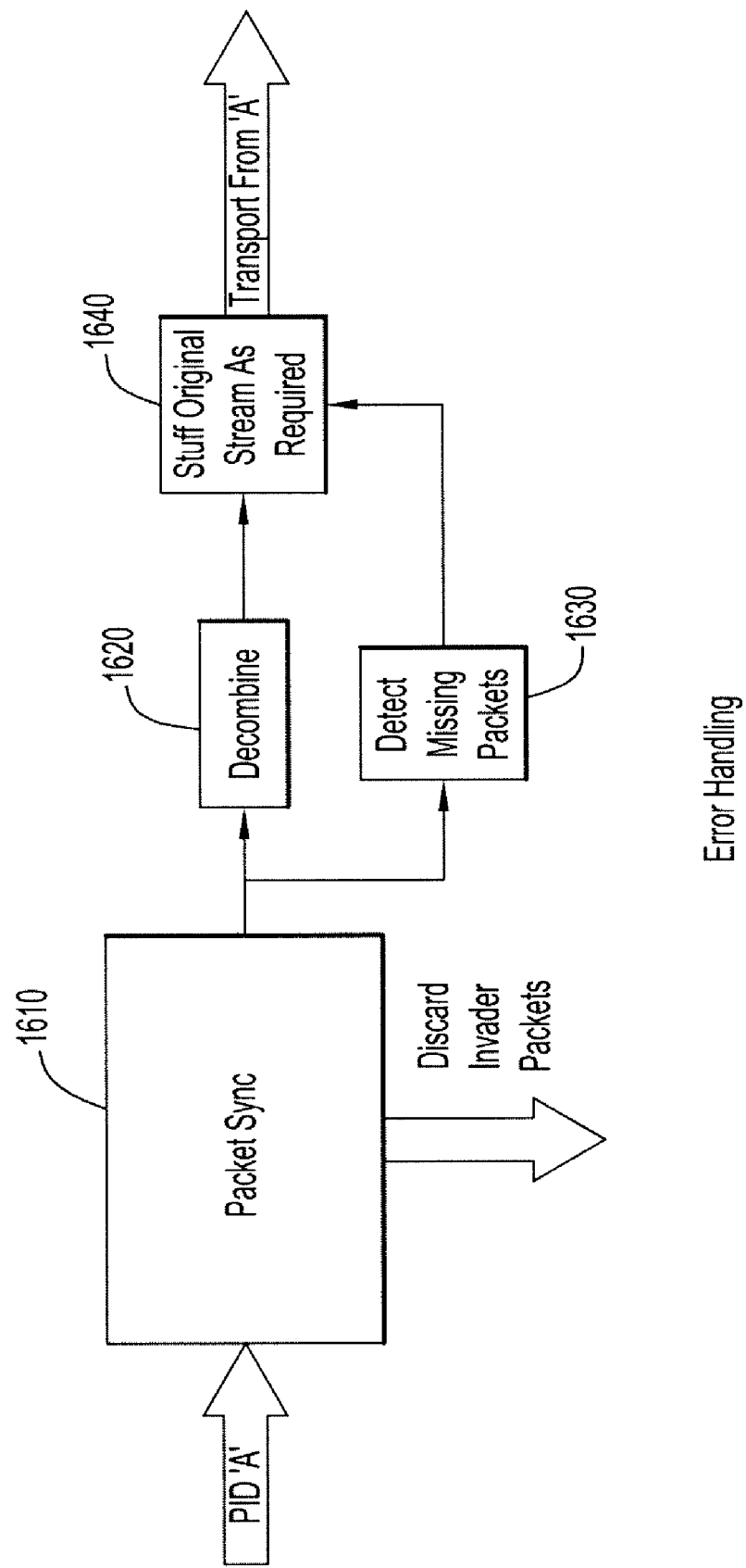
FIGS. 16 and 17 depict packet error correction approaches in accordance with embodiments of the present invention.

More specifically, error handling seeks to manage stream rates by discarding foreign packets and stuffing up packet rates for each decombined TS as presented in FIG. 16. Synchronization and packet management was previously summarized in FIGS. 15A-D. Referring to FIG. 16, packet synchronization occurs at block 1610 and packets that are determined not to belong in the stream are designated as invader packets and discarded. The stream is decombined at block 1620 and missing packets are detected at block 1630. Block 1640 represents packet stuffing in response to error handling processes as described with respect to FIGS. 15A-D.

Thus, one implementation may utilize a number of mechanisms to determine where and how many packets are missing. For example, each combined PID which is routed for processing is assessed in isolation (as indicated in FIGS. 15A-D and 16). Indeed, the vast majority of errors are likely not correctable, and thus emphasizing stuffing packet insertion produces the best return on investment.

Figure 17:
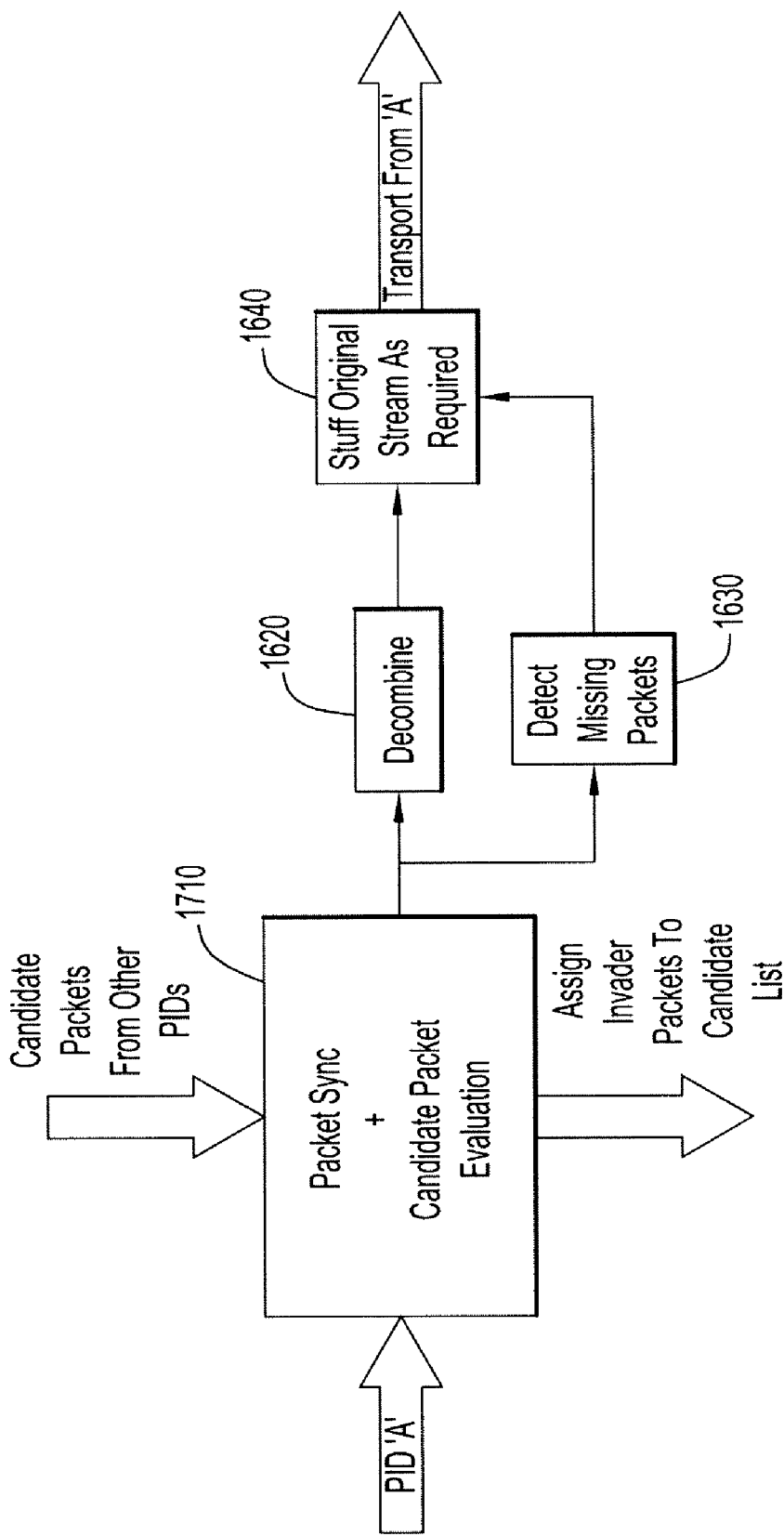

However, if information from the error handling blocks (one for each routed PID) is shared (using more complicated logic), some otherwise discarded packets may be recovered thereby improving stream restoration. Little may be done for corrupted payloads at the packet synchronization stage—the best objective is to compare header information for candidate packets for recovery across all blocks. In this regard, FIG. 17 adds coordinated packet evaluation to the synchronization stage in place of immediate packet discard. As shown, the packet synchronization block 1610 is replaced with a packet synchronization and candidate packet evaluation block 1710. Block 1710 is responsible for receiving candidate packets from other PIDs (or reviewing a list of such packets) and assigning any invader packets to a candidate list.

In accordance with an embodiment of the present invention, candidate packet processing considers the following, An invader packet must have come from another PID in the input TS.

An equivalent gap or gaps must exist in another PID

Only gaps in combined streams are of interest

When an invader packet is identified, it is preferably labeled and presented to all error handling blocks Only those combined streams with open gaps need evaluate the candidate list.

If more than one evaluation block attempts to claim a candidate then assignment is dictated by the closest match according to the considerations noted below.

Once a candidate has been claimed by another PID, the candidate is removed from the list.

Once removed from the list, a candidate may not be considered by the remaining evaluation blocks. The packet is re-stamped with the correct PID and inserted in the stream for further processing.

If packet damage extends to the payload, the decombined TS will still suffer some damage.

If more than one block is configured for the same combined stream then all such blocks make the same candidate selection.

If a candidate cannot be claimed by any of the evaluation blocks then the candidate is discarded.

The relatively small number of combined streams in this system (typically less than 20 versus hundreds in a normal TS) permits a practical implementation of this approach.

Coordinated candidate evaluation considerations include

Balancing

There may be candidates unclaimed at the end of an evaluation pass

Unclaimed candidates must be buffered for use on subsequent evaluation passes until every stream being decombined has either processed an incoming packet, processed a candidate packet, or defaulted to inserting a stuffing packet. This is necessary to ensure that all streams being decombined have had opportunity to detect a gap if one was caused by the invader packet.

Some invader packets may have come from PSI/SI, other ES in the same carrier or combined streams not currently being decombined Header Consistency
   Some part of the header must match the stream evaluating the candidate
   Typically, continuity count and a portion of the packet ID should be consistent
Number of Bit Errors
   The stream requiring the least number of bit changes to the candidate's header should be considered the most probable match
   Again, this is not perfect but it permits a practical response
Sync Byte Location
   As an additional check on suitability as well as an indirect check on payload integrity, locate the candidate's payload sync byte and compare it to the proposed stream's current sequence
   This test requires that the payloads be descrambled before comparison Deep checking of the payload would require simultaneous evaluation of PIDs referenced within each decombined TS. This could easily extend error evaluation to thousands of PIDs when attempting to place just one candidate packet. Although the attempt is conceivable, the design complexity may be not be justified by the return.

Further System Considerations

It will be apparent to those skilled in the art that various modifications and variations can be made in the systems and methods described herein consistent with the principles of the present invention without departing from the scope or spirit of the invention. Although several embodiments have been described above, other variations are possible consistent with the principles of the present invention.

For example, with respect to scrambling, in the described implementation, BISS scrambling is employed to scramble combined packet payload (see, e.g., FIG. 3B). Other implementations need not be restricted to BISS scrambling, however. Payloads of the combined packets may use any scrambling mechanism provided that suitable signaling is provided to the downlink device. If multiple layers of encapsulation are employed to combine successive groups of TS, then each layer may utilize the same or different CA mechanisms as desired. The principal restrictions are that each layer's packets be scrambled before the next level of combining and that CA signaling be included at each layer. Descrambling and packet extraction follow in the reverse order of the original transmission combining stages. Note that each layer need only be aware of its own CA mechanism—other layers process their CA algorithms separately. Of course, the standard limitation applies in that descrambling at each layer must be completed before the associated de-combining.

Each branch of a combined TS may be extracted by a suitably configured local device much like peeling an onion. The newly exposed layers may be routed onward to other devices that may de-combine (and descramble) as required. The lowest level data packets remain secure until the final descrambling device—decrypting information need not be revealed prior to that last stage.

Disaster Recovery

In accordance with embodiments of the present invention, the same signal may be applied to multiple inputs of the MTR 130 for decombining and routing purposes. A redundant configuration on additional input ports provides automated switching such that if one of the redundant signals is lost, the remaining port(s) provide immediate alternates. If different source paths are provided for the same transports and these same transports are redundantly configured on the MTR 130 then automated switching recovers the output streams in the event of an event (disaster) which disrupts one of these same inputs.

The concept may be extended further if a TS is configured specifically as a redundant backup for two or more primary TS. Failure of the primary TS would result in the backup TS being selected. The backup TS may provide full or partial signal coverage. Further advantages accrue from using different type transport paths (e.g. satellite, fibre, terrestrial, local storage). Embodiments of the present invention may take advantage of multiple type inputs to feed several output devices requiring immediate backup switching. Additionally, the combining process provides access to more TS inputs. This offers greater flexibility in configuring redundant backup paths.

Typically, multiple input devices are limited to one TS per input. The combining process allows a multiplier to be added to this stage although overall bandwidth is still limited to the maximum rating of the physical interface.

The MTR 130 can be configured to provide dedicated Disaster Recovery controls with varied input TS formats and varied TS outputs for one or more downstream devices. In the event of a primary input link failure, an alternate input is selected that carries a TS designated as backup to the primary input. The combined PIDs within the backup TS are extracted and routed according to the backup configuration selected. The configuration may be as general as specifying the original CT ID be located in the backup TS or as explicit as defining known TS PIDs and service PIDs for routing.

This approach permits standardized disaster recovery services for system interfaces and devices that do not incorporate disaster recovery functionality of their own.

The compliant nature of the TS allows the backup and primary TS to be routed through routing and multiplexing devices without loss of signaling and rate control information. This permits the backup TS characteristics to be scaled according to system capabilities and management desires.

Table for Program Identification

Unlike a conventional TS, a combined TS completely obscures its contents. The minimum in-band data transmitted in a combined carrier facilitates the de-combining process but is not required to reveal TS content.

Various options are possible, including:
1. Transmit no in-band data
   a. Receiving devices must be manually configured with previously arranged details of the combined TS and scrambling keys
   b. No synchronization between transmitting and receiving sites
   c. No indication of TS content
2. Transmit in-band data for configuration
   a. Receiving devices once connected to a carrier configure tuning, routing, TS selection, and CA
   b. System synchronization maintained through in-band data
   c. No indication of TS content
      i. TS must be de-combined and examined for services
3. Transmit in-band data for configuration and service identification
   a. Receiving devices once connected to a carrier configure tuning, routing, TS selection, and CA
   b. System synchronization maintained through in-band data
   c. List service IDs and PMTs of the combined TS within an additional, optional private descriptor
      i. The TS need not be de-combined to identify the contained services ii. Each encapsulation layer may include the descriptor or not, independent of option selection in all other layers
iii. The descriptor may include references to all encapsulated layers from the current level
   1. This would provide the most direct tuning and selection mechanism SciMux PSI/SI Encapsulation In embodiments of the present invention, SciMux PSI/SI tables are transmitted without encapsulation in order to facilitate system flexibility and compliance with other networks. It is possible to encapsulate and scramble the packets associated with these tables, too. A typical carrier would be comprised of a plurality of combined PIDs but lacking any reference tables. System security is enhanced by this additional step but the following conditions apply:
1. Receiving devices must be manually configured with previously arranged details of the combined TS and scrambling keys
2. A descriptor, such as in an additional PMT employing the mechanism previously noted, could be transmitted with the BISS key index and PID for the PSI/SI combined packet stream
   a. The PSI/SI are first de-combined
   b. The information in the PSI/SI so de-combined is then applied to extract the additional TS as previously described
3. Alternatively, a different CA system could be applied at the uppermost layer to first extract the SciMux PSI/SI tables then the actual transports
4. System synchronization maintained between transmitting and receiving sites once PSI/SI extracted Other embodiments of the invention will be apparent to those skilled in the art from consideration of the specification and practice of the disclosed embodiments. The specification and examples are exemplary only, and the true scope and spirit of the invention is defined by the following claims and their equivalents.

What is claimed is:

1. A variable bandwidth phase lock loop (PLL), comprising:
a phase offset accumulator configured to:
   provide a phase compensation signal that is subtracted from a phase error, the phase error being derived from an input clock reference (ICR) value and a recovered clock reference (RCR) value; and
   add a loop filter output to the phase offset accumulator in response to a renormalization signal;
a loop filter configured to:
   receive a signal corresponding to the difference in the phase error and the phase compensation signal; and
   provide the loop filter output to (i) the phase offset accumulator, (ii) a programmable user gain, and (iii) a phase error summing component;
a voltage controlled oscillator (VCO) offset accumulator configured to:
   provide a voltage offset signal that is added to a voltage output by the user gain; and
   add the voltage output by the user gain to the VCO offset accumulator in response to the renormalization signal;
wherein the phase error summing component is configured to add the phase compensation signal and the loop filter output to provide a filtered phase error signal;
wherein the RCR value is generated based on a sum of the voltage offset signal and voltage output by the user gain.

2. The PLL of claim 1, wherein the PLL is a digital PLL.

3. The PLL of claim 1, further comprising an output node that outputs an effective local recovered clock reference (ERCR) that is a sum of the filtered phase error and the RCR value.

4. The PLL of claim 1, further comprising an output node that outputs the RCR value in response to a signal corresponding to the sum of the voltage offset signal and the voltage output by the user gain.

5. The PLL of claim 1, further comprising a control action input configured to receive the renormalization signal.

6. The PLL of claim 5, wherein receipt of the renormalization signal causes integer bits of an infinite impulse response (IIR) corresponding to the output of the loop filter to be added into the phase offset accumulator and the IIR to reset to zero.

7. The PLL of claim 1, further comprising a PLL controller that receives an adaptation field arrival time pulse, the PLL controller being configured to provide the renormalization signal to the PLL.

8. A variable bandwidth phase locked loop (PLL), comprising:
a phase comparator configured to provide a phase error based on an input clock reference (ICR) value and a recovered clock reference (RCR) value;
a subtractor configured to provide a difference signal corresponding to a difference between a phase compensation signal and a signal generated responsive to the phase error;
a phase offset accumulator configured to provide the phase compensation signal in response to a renormalization signal;
a loop filter configured to receive the difference signal and provide a loop filter output to (i) the phase offset accumulator, (ii) a programmable user gain component and (iii) a phase error summing component;
the phase error summing component configured to add the loop filter output to the compensation signal to provide a filtered phase error signal;
a voltage controlled oscillator (VCO) offset accumulator configured to provide a voltage offset signal in response to an output of the programmable user gain component and the renormalization signal;
an adder configured to add the output of the programmable user gain component and the voltage offset signal;
a direct digital synthesizer (DDS) counter configured to provide the RCR value in response to a signal corresponding to the output of the adder.

9. A method of operating a variable bandwidth phase locked loop (PLL), comprising:
generating a phase error based on an input clock reference (ICR) value and a recovered clock reference (RCR) value;
storing, at a phase offset accumulator, a loop filter output in response to a renormalization signal;
providing, from the phase offset accumulator, a phase offset signal corresponding to the loop filter output wherein the phase offset signal is subtracted from the phase error;
receiving, at the loop filter, a signal corresponding to the difference between the phase offset signal and the phase error;
adding the phase offset signal and the loop filter output to provide a filtered phase error;
providing the loop filter output to an input of a user gain that has a programmable gain;
storing, at a voltage controlled oscillator (VCO) offset accumulator, a voltage output signal output by the user gain in response to the renormalization signal;

providing, from the VCO offset accumulator, a voltage offset signal;

adding the voltage output signal output by the user gain and the voltage offset signal to provide an offset gain signal;

providing the RCR value based on the offset gain signal; and adding the RCR and the filtered phase error to provide an effective recovered clock reference (ERCR) value.

10. The method of claim 9, further comprising applying the renormalization signal to the PLL.

11. The method of claim 10, further comprising, in response to the renormalization signal, causing integer bits of an infinite impulse response (IIR) corresponding to the loop filter output to be added into the phase offset accumulator and the IIR to reset to zero.

12. The method of claim 10, further comprising receiving the renormalization signal from a PLL controller.

13. The method of claim 12, further comprising supplying the PLL controller with a pulse indicative of an arrival time of information containing the ICR.

14. The method of claim 12, wherein the PLL is used to recover a Moving Pictures Expert Group 2 (MPEG-2) system clock, in which an adaptation field (AF) of an MPEG compliant transport stream carries the ICR as an MPEG-2 program clock reference (PCR).

* * * * *